United States Patent
Ludwig

(10) Patent No.: US 9,632,344 B2
(45) Date of Patent: Apr. 25, 2017

(54) USE OF LED OR OLED ARRAY TO IMPLEMENT INTEGRATED COMBINATIONS OF TOUCH SCREEN TACTILE, TOUCH GESTURE SENSOR, COLOR IMAGE DISPLAY, HAND-IMAGE GESTURE SENSOR, DOCUMENT SCANNER, SECURE OPTICAL DATA EXCHANGE, AND FINGERPRINT PROCESSING CAPABILITIES

(71) Applicant: Lester F. Ludwig, Belmont, CA (US)

(72) Inventor: Lester F. Ludwig, Belmont, CA (US)

(73) Assignee: Lester F. Ludwig, San Antonio, TX (US)

( * ) Notice: Subject to any disclaimer, the term of this patent is extended or adjusted under 35 U.S.C. 154(b) by 0 days.

(21) Appl. No.: 13/961,611

(22) Filed: Aug. 7, 2013

(65) Prior Publication Data

US 2014/0036168 A1    Feb. 6, 2014

Related U.S. Application Data

(63) Continuation-in-part of application No. 13/180,345, filed on Jul. 11, 2011.
(Continued)

(51) Int. Cl.
    *G09G 3/32* (2016.01)
    *G02F 1/1333* (2006.01)
    (Continued)

(52) U.S. Cl.
    CPC ........ *G02F 1/13338* (2013.01); *G06F 3/044* (2013.01); *G06F 3/0412* (2013.01);
    (Continued)

(58) Field of Classification Search
    CPC .................................................. G06F 3/0412
    (Continued)

(56) References Cited

U.S. PATENT DOCUMENTS

| 4,748,676 A | 5/1988 | Miyagawa |
| 4,899,137 A | 2/1990 | Behrens et al. |

(Continued)

FOREIGN PATENT DOCUMENTS

| EP | 0 574 213 B1 | 12/1993 |
| WO | WO 99/38324 | * 7/1999 |

OTHER PUBLICATIONS

Dulberg, M. S., et al. An Imprecise Mouse Gesture for the Fast Activation of Controls, IOS Press, Aug. 1999, [online] [retrieved on Jul. 9, 2013] URL: http://www.csc.ncsu.edu/faculty/stamant/papers/interact.pdf.gz, 10 pgs.
(Continued)

*Primary Examiner* — Thanh Luu
(74) *Attorney, Agent, or Firm* — Procopio, Cory, Hargreaves & Savitch LLP

(57) ABSTRACT

A system and method for implementing a display which also serves as one or more of a tactile user interface touchscreen, proximate hand gesture sensor, light field sensor, lensless imaging camera, document scanner, fingerprint scanner, and secure optical communications interface. In an implementation, an OLED array can be used for light sensing as well as light emission functions. In one implementation a single OLED array is used as the only optoelectronic user interface element in the system. In another implementation two OLED arrays are used, each performing and/or optimized from different functions. In another implementation, an LCD and an OLED array are used in various configurations. The resulting arrangements allow for sharing of both optoelectric devices as well as associated electronics and computational processors, and are accordingly advantageous for use in handheld devices such as cellphone, smartphones, PDAs, tablet computers, and other such devices.

20 Claims, 22 Drawing Sheets

Related U.S. Application Data

(60) Provisional application No. 61/363,181, filed on Jul. 9, 2010.

(51) Int. Cl.
*G06F 3/041* (2006.01)
*H01L 27/32* (2006.01)
*G06F 3/044* (2006.01)
*G06F 3/0488* (2013.01)

(52) U.S. Cl.
CPC ........ *G06F 3/04883* (2013.01); *H01L 27/323* (2013.01); *H01L 27/3227* (2013.01); *H01L 27/3232* (2013.01); *G06F 2203/04101* (2013.01); *G06F 2203/04106* (2013.01); *H01L 2251/5323* (2013.01)

(58) Field of Classification Search
USPC ..................................... 250/221; 345/82, 83
See application file for complete search history.

(56) References Cited

U.S. PATENT DOCUMENTS

| | | | |
|---|---|---|---|
| 5,237,647 A | 8/1993 | Roberts et al. | |
| 5,270,711 A | 12/1993 | Knapp | |
| 5,292,999 A | 3/1994 | Tumura | |
| 5,341,133 A | 8/1994 | Savoy | |
| 5,347,295 A | 9/1994 | Agulnick et al. | |
| 5,357,048 A | 10/1994 | Sgroi | |
| 5,378,850 A | 1/1995 | Tumura | |
| 5,386,219 A | 1/1995 | Greanias | |
| 5,420,936 A | 5/1995 | Fitzpatrick | |
| 5,440,072 A | 8/1995 | Willis | |
| 5,442,168 A | 8/1995 | Gurner et al. | |
| 5,459,282 A | 10/1995 | Willis | |
| 5,471,008 A | 11/1995 | Fujita et al. | |
| 5,475,214 A | 12/1995 | DeFranco et al. | |
| 5,565,641 A | 10/1996 | Gruenbaum | |
| 5,585,588 A | 12/1996 | Tumura | |
| 5,592,572 A | 1/1997 | Le | |
| 5,592,752 A | 1/1997 | Fu | |
| 5,659,145 A | 8/1997 | Weil | |
| 5,659,466 A | 8/1997 | Norris et al. | |
| 5,665,927 A | 9/1997 | Taki et al. | |
| 5,668,338 A | 9/1997 | Hewitt et al. | |
| 5,675,100 A | 10/1997 | Hewlett | |
| 5,717,939 A | 2/1998 | Bricklin et al. | |
| 5,719,347 A | 2/1998 | Masubachi et al. | |
| 5,719,561 A | 2/1998 | Gonzales | |
| 5,724,985 A | 3/1998 | Snell | |
| 5,741,993 A | 4/1998 | Kushimiya | |
| 5,748,184 A | 5/1998 | Shieh | |
| 5,763,806 A | 6/1998 | Willis | |
| 5,786,540 A | 7/1998 | Westlund | |
| 5,801,340 A | 9/1998 | Peter | |
| 5,805,137 A | 9/1998 | Yasutake | |
| 5,824,930 A | 10/1998 | Ura et al. | |
| 5,827,989 A | 10/1998 | Fay et al. | |
| 5,841,428 A | 11/1998 | Jaeger et al. | |
| 5,850,051 A | 12/1998 | Machover et al. | |
| 5,852,251 A | 12/1998 | Su et al. | |
| 5,889,236 A | 3/1999 | Gillespie et al. | |
| 5,932,827 A | 8/1999 | Osborne et al. | |
| 5,969,283 A | 10/1999 | Looney et al. | |
| 5,977,466 A | 11/1999 | Muramatsu | |
| 5,986,224 A | 11/1999 | Kent | |
| 6,005,545 A | 12/1999 | Nishida et al. | |
| 6,037,937 A | 3/2000 | Beaton et al. | |
| 6,047,073 A | 4/2000 | Norris et al. | |
| 6,051,769 A | 4/2000 | Brown, Jr. | |
| 6,100,461 A | 8/2000 | Hewitt | |
| 6,107,997 A | 8/2000 | Ure | |
| 6,140,565 A | 10/2000 | Yamauchi et al. | |
| 6,204,441 B1 | 3/2001 | Asahi et al. | |
| 6,225,975 B1 | 5/2001 | Furuki et al. | |
| 6,285,358 B1 | 9/2001 | Roberts | |
| 6,288,317 B1 | 9/2001 | Willis | |
| 6,310,279 B1 | 10/2001 | Suzuki et al. | |
| 6,310,610 B1 | 10/2001 | Beaton et al. | |
| 6,320,112 B1 | 11/2001 | Lotze | |
| 6,323,846 B1 | 11/2001 | Westerman et al. | |
| 6,360,019 B1 | 3/2002 | Chaddha | |
| 6,363,159 B1 | 3/2002 | Rhoads | |
| 6,373,475 B1 | 4/2002 | Challis | |
| 6,392,636 B1 | 5/2002 | Ferrari | |
| 6,392,705 B1 | 5/2002 | Chaddha | |
| 6,400,836 B2 | 6/2002 | Senior | |
| 6,404,898 B1 | 6/2002 | Rhoads | |
| 6,408,087 B1 | 6/2002 | Kramer | |
| 6,570,078 B2 | 5/2003 | Ludwig | |
| 6,703,552 B2 | 3/2004 | Haken | |
| 6,717,560 B2* | 4/2004 | Cok .................. H01L 27/288 345/81 |
| 6,793,619 B1 | 9/2004 | Blumental | |
| 6,917,723 B1* | 7/2005 | Tamburrini ........ G06K 7/10851 382/317 |
| 7,030,860 B1 | 4/2006 | Hsu et al. | |
| 7,408,108 B2 | 8/2008 | Ludwig | |
| 7,557,797 B2 | 7/2009 | Ludwig | |
| 7,598,949 B2 | 10/2009 | Han | |
| 7,611,409 B2 | 11/2009 | Muir et al. | |
| 7,859,526 B2* | 12/2010 | Konicek .................. 345/207 |
| 8,154,529 B2 | 4/2012 | Sleeman | |
| 8,169,414 B2 | 5/2012 | Lim | |
| 8,170,346 B2 | 5/2012 | Ludwig | |
| 8,179,376 B2 | 5/2012 | Griffin | |
| 8,345,014 B2 | 1/2013 | Lim | |
| 2001/0036299 A1 | 11/2001 | Senior | |
| 2002/0005108 A1 | 1/2002 | Ludwig | |
| 2002/0093491 A1 | 7/2002 | Gillespie et al. | |
| 2004/0074379 A1 | 4/2004 | Ludwig | |
| 2004/0118268 A1 | 6/2004 | Ludwig | |
| 2004/0251402 A1 | 12/2004 | Reime | |
| 2005/0200296 A1* | 9/2005 | Naugler et al. ................ 315/150 |
| 2006/0252530 A1 | 11/2006 | Oberberger et al. | |
| 2007/0044019 A1 | 2/2007 | Moon | |
| 2007/0063990 A1 | 3/2007 | Park | |
| 2007/0229477 A1 | 10/2007 | Ludwig | |
| 2008/0010616 A1 | 1/2008 | Algreatly | |
| 2008/0143690 A1 | 6/2008 | Jang | |
| 2008/0164076 A1 | 7/2008 | Orsley | |
| 2008/0174530 A1* | 7/2008 | Booth et al. ..................... 345/82 |
| 2008/0259053 A1 | 10/2008 | Newton | |
| 2008/0297482 A1 | 12/2008 | Weiss | |
| 2008/0300055 A1 | 12/2008 | Lutnick | |
| 2008/0309634 A1 | 12/2008 | Hotelling et al. | |
| 2009/0006292 A1 | 1/2009 | Block | |
| 2009/0027351 A1 | 1/2009 | Zhang et al. | |
| 2009/0124348 A1 | 5/2009 | Yoseloff et al. | |
| 2009/0146968 A1 | 6/2009 | Narita et al. | |
| 2009/0167701 A1 | 7/2009 | Ronkainen | |
| 2009/0254869 A1 | 10/2009 | Ludwig | |
| 2010/0013860 A1 | 1/2010 | Mandella | |
| 2010/0044121 A1 | 2/2010 | Simon | |
| 2010/0060607 A1 | 3/2010 | Ludwig | |
| 2010/0079385 A1 | 4/2010 | Holmgren | |
| 2010/0087241 A1 | 4/2010 | Nguyen et al. | |
| 2010/0090963 A1 | 4/2010 | Dubs | |
| 2010/0110025 A1 | 5/2010 | Lim | |
| 2010/0117978 A1 | 5/2010 | Shirado | |
| 2010/0177118 A1 | 7/2010 | Sytnikov | |
| 2010/0231612 A1 | 9/2010 | Chaudhri et al. | |
| 2010/0232710 A1 | 9/2010 | Ludwig | |
| 2010/0289754 A1 | 11/2010 | Sleeman et al. | |
| 2010/0302172 A1 | 12/2010 | Wilairat | |
| 2010/0328032 A1 | 12/2010 | Rofougaran | |
| 2011/0007000 A1 | 1/2011 | Lim | |
| 2011/0037735 A1 | 2/2011 | Land | |
| 2011/0063251 A1 | 3/2011 | Geaghan | |
| 2011/0086706 A1 | 4/2011 | Zalewski | |
| 2011/0202889 A1 | 8/2011 | Ludwig | |
| 2011/0202934 A1 | 8/2011 | Ludwig | |
| 2011/0260998 A1 | 10/2011 | Ludwig | |

(56) References Cited

U.S. PATENT DOCUMENTS

| | | |
|---|---|---|
| 2011/0261049 A1 | 10/2011 | Cardno et al. |
| 2011/0285648 A1 | 11/2011 | Simon et al. |
| 2012/0007821 A1 | 1/2012 | Zaliva |
| 2012/0034978 A1 | 2/2012 | Lim |
| 2012/0056846 A1 | 3/2012 | Zaliva |
| 2012/0108323 A1 | 5/2012 | Kelly et al. |
| 2012/0192119 A1 | 7/2012 | Zaliva |
| 2012/0194461 A1 | 8/2012 | Lim |
| 2012/0194462 A1 | 8/2012 | Lim |
| 2012/0195522 A1 | 8/2012 | Ludwig |
| 2012/0223903 A1 | 9/2012 | Ludwig |
| 2012/0235940 A1 | 9/2012 | Ludwig |
| 2012/0262401 A1 | 10/2012 | Rofougaran |
| 2012/0280927 A1 | 11/2012 | Ludwig |
| 2012/0317521 A1 | 12/2012 | Ludwig |
| 2013/0009896 A1 | 1/2013 | Zaliva |
| 2013/0038554 A1 | 2/2013 | West |

OTHER PUBLICATIONS

Moyle, M., et al. A Flick in the Right Direction: A Case Study of Gestural Input, Conferences in Research and Practice in Information Technology, vol. 18, Jan. 2005; New Zealand, [online] [retrieved on Jul. 9, 2013] URL:http://www.cosc.canterbury.ac.nz/andrew.cockburn/papers/moyle-cockburn.pdf, 27 pgs.

Maltoni, D., et al., "Handbook of Fingerprint Recognition," Springer Professional Computing, 2nd ed. 2009, XVI, p. 74, p. 361, [online] [retrieved on Jul. 9, 2013] URL: http://books.google.com/books?id=1Wpx25D8qOwC&pg=PA361&lpg=PA361&dq=fingerprint+minutiae, 2 pgs.

VeriFinger Information, [online] [retrieved on Jun. 11, 2013] URL: http://www.fingerprint-it.com/_sol_verifinger.html, 2 pgs.

Prabhakar S., et al., Learning fingerprint minutiae location and type, Pattern Recognition 2003, 36, [online] URL: http://www.cse.msu.edu/biometrics/Publications/Fingerprint/PrabhakarJainPankanti_MinaLocType_PR03.pdf, pp. 1847-1857.

Garcia Reyes, E., An Automatic Goodness Index to Measure Fingerprint Minutiae Quality, Progress in Pattern Recognition, Image Analysis and Applications, Lecture Notes in Computer Science vol. 3773, 2005, pp. 578-585, [online] [retrieved on Jun. 2, 2013] URL: http://www.researchgate.net/publication/226946511_An_Automatic_Goodness_Index_to_Measure_Fingerprint_Minutiae_Quality/file/d912f50ba5e96320d5.pdf.

Kayaoglu, M., et al., Standard Fingerprint Databases: Manual Minutiae Labeling and Matcher Performance Analyses, arXiv preprint arXiv:1305.1443, 2013, 14 pgs, [online] [retrieved on Jun. 2, 2013] URL: http://arxiv.org/ftp/arxiv/papers/1305/1305.1443.pdf.

Alonso-Fernandez, F., et al., Fingerprint Recognition, Chapter 4, Guide to Biometric Reference Systems and Performance Evaluation, (Springer, London, 2009, pp. 51-90, [online] [retrieved on Jun. 2, 2013] URL: http://www2.hh.se/staff/josef/public/publications/alonso-fernandez09chapter.pdf.

Image moment, Jul. 12, 2010, 3 pgs, [online] [retrieved on Jun. 13, 2013] URL: http://en.wikipedia.org/wiki/Image_moment.

Nguyen, N., et al., Comparisons of sequence labeling algorithms and extensions, Proceedings of the 24th International Conference on Machine Learning, 2007, [online] [retrieved on Jun. 2, 2013] URL: http://www.cs.cornell.edu/~nhnguyen/icml07structured.pdf, pp. 681-688.

Nissen, S., Implementation of a Fast Artificial Neural Network Library (FANN), Department of Computer Science University of Copenhagen (DIKU)}, Oct. 31, 2003, [online] [retrieved on Jun. 21, 2013] URL: http://mirror.transact.net.au/sourceforge/f/project/fa/fann/fann_doc/1.0/fann_doc_complete_1.0.pdf, 92 pgs.

Igel, C., et al., Improving the Rprop Learning Algorithm, Proceedings of the Second International ICSC Symposium on Neural Computation (NC 2000), 2000, 2000, [online] [retrieved on Jun. 2, 2013] URL: http://citeseerx.ist.psu.edu/viewdoc/download?doi=10.1.1.17.3899&rep=rep1&type=pdf, pp. 115-121.

Bishop, C.M., Pattern Recognition and Machine Learning, Springer New York, 2006, pp. 561-593.

Euler Angles, 2011, [online] [retrieved on Jun. 30, 2011] URL: http://en.wikipedia.org/w/index.php?title=Euler_angles&oldid=436460926, 8 pgs.

Electronic Statistics Textbook, StatSoft, Inc., 2011, [online] [retrieved on Jul. 1, 2011] URL: http://www.statsoft.com/textbook, 1 pg.

Central Moment, Dec. 16, 2009, [online] [retrieved on Oct. 26, 2010] URL: http://en.wikipedia.org/w/index.php?title=Central_moment&oldid=332048374.

Local regression, Nov. 16, 2010, [online] [retrieved on Jun. 28, 2011] URL: http://en.wikipedia.org/w/index.php?title=Local_regression&oldid=416762287.

USPTO Notice of Allowance dated Jun. 6, 2013 issued in U.S. Appl. No. 13/846,830, filed Mar. 18, 2013.

Hernandez-Leon, R., et al., Classifying using Specific Rules with High Confidence, 9th Mexican International Conference on Artificial Intelligence, IEEE, Nov. 2010, pp. 75-80.

Fang, Y., et al., Dynamics of a Winner-Take-All Neural Network, Neural Networks, 9(7), Oct. 1996, pp. 1141-1154.

Moog, R. A., The Human Finger—A Versatile Electronic Music Instrument Component, Audio Engineering Society Preprint, 1977, New York, NY, 4 pgs.

Johnson, C., Image sensor tracks moving objects in hardware, Electronic Engineering Times, Apr. 5, 1999, 1 pg.

Kaoss pad dynamic effect/controller, Korg Proview Users' magazine Summer 1999, 2 pgs.

Leiberman, D., Touch screens extend grasp Into consumer realm, Electronic Engineering Times, Feb. 8, 1999.

Lim, et al., A Fast Algorithm For Labelling Connected Components in Image Arrays, Technical Report Series, No. NA86-2, Thinking Machines Corp., 1986 (rev. 1987), Cambridge, Mass., USA, 17 pgs.

Pennywitt, K., Robotic Tactile Sensing, Byte, Jan. 1986, 14 pgs.

Review of KORG X-230 Drum (later called Wave Drum), Electronic Musician, Apr. 1994, 1 pg.

Rich, R., Buchla Lightning MIDI Controller, Electronic Musician, Oct. 1991, 5 pgs.

Rich, R., Buchla Thunder, Electronic Musician, Aug. 1990, 4 pgs.

Dario P., et al., Tactile sensors and the gripping challenge, IEEE Spectrum, vol. 5, No. 22, Aug. 1985, pp. 46-52.

Snell, J. M., Sensors for Playing Computer Music with Expression, Proceedings of the Intl. Computer Music Conf. at Eastman, 1983, pp. 113-126.

Verner J., Artif Starr Switch Company Ztar 624-D, Electronic Musician, Nov. 1994, 5 pgs.

Haken, L., An Indiscrete Music Keyboard, Computer Music Journal, Spring 1998, pp. 30-48.

USPTO Notice of Allowance dated May 8, 2013 issued in U.S. Appl. No. 12/541,948, filed Aug. 15, 2009.

Buxton, W. A. S., Two-Handed Document Navigation, Xerox Disclosure Journal, 19(2), Mar./Apr. 1994 [online] [retrieved on May 28, 2013] URL: http://www.billbuxton.com/2Hnavigation.html, pp. 103-108.

USPTO Notice of Allowance dated Mar. 20, 2012 issued in U.S. Appl. No. 12/724,413, filed Mar. 15, 2010.

USPTO Notice of Allowance dated Jan. 10, 2008 issued in U.S. Appl. No. 10/683,914, filed Oct. 10, 2003.

USPTO Notice of Allowance dated Nov. 9, 2012 issued in U.S. Appl. No. 12/502,230, filed Jul. 13, 2009.

USPTO Notice of Allowance dated Mar. 12, 2012 issued in U.S. Appl. No. 12/511,930, filed Jul. 29, 2009.

USPTO Notice of Allowance dated May 16, 2013 issued in U.S. Appl. No. 13/441,842, filed Apr. 7, 2012.

USPTO Notice of Allowance dated May 24, 2013 issued in U.S. Appl. No. 13/442,815, filed Apr. 9, 2012.

USPTO Notice of Allowance dated Dec. 24, 2002 issued in U.S. Appl. No. 09/812,870, filed Mar. 19, 2001.

Otsu's method, [online] [retrieved on Jun. 26, 2013] URL: http://en.wikipedia.org/wiki/Otsu_method, Sep. 13, 2010, 2 pgs.

(56) References Cited

OTHER PUBLICATIONS

Principal component analysis, [online] [retrieved on Jun. 26, 2013] URL: http://en.wikipedia.org/wiki/Principal_component_analysis, Feb. 25, 2011, 9 pgs.
USPTO Notice of Allowance dated May 30, 2013 issued in U.S. Appl. No. 13/442,806, filed Apr. 9, 2012.
DIY Touchscreen Analysis, MOTO, [online] [retrieved on May 12, 2013] URL: http://labs.moto.com/diy-touchscreen-analysis/, Jul. 15, 2010, 23 pgs.
Wilson, T.V., How the iPhone Works, howstuffworks, [online] [retrieved on May 12, 2013] URL: http://electronics.howstuffworks.com/iphone2.htm, Jan. 8, 2011, 11 pgs.
Walker, G., Touch and the Apple iPhone, Veritas et Visus, [online] [retrieved on May 12, 2013] URL: http://www.veritasetvisus.com/VVTP-12,%20Walker.pdf, Feb. 2007, pp. 50-54.
Han, J., Multi-Touch Sensing through LED Matrix Displays (video), [online] [retrieved on May 12, 2013] "http://cs.nyu.edu/~jhan/ledtouch/index.html," Feb. 18, 2011, 1 pg.
Roberts Cross, [online] [retrieved on May 12, 2013] URL: http://en.wikipedia.org/wiki/Roberts_Cross, Jul. 20, 2010, visited Feb. 28, 2011, 3 pgs.
Sobel Operator, [online] [retrieved on May 12, 2013] URL: http://en.wikipedia.org/wiki/Sobel_operator, Mar. 12, 2010, visited Feb. 28, 2011, 5 pgs.
Prewitt, [online] [retrieved on May 12, 2013] URL: http://en.wikipedia.org/wiki/Prewitt, Mar. 15, 2010, visited Feb. 28, 2011, 2 pgs.
Coefficient of variation, [online] [retrieved on May 12, 2013] URL: http://en.wikipedia.org/wiki/Coefficient_of_variation, Feb. 15, 2010, visited Feb. 28, 2011, 2 pgs.
Canny edge detector, [online] [retrieved on May 12, 2013] http://en.wikipedia.org/wiki/Canny_edge_detector, Mar. 5, 2010, 4 pgs.
Polynomial regression, [online] [retrieved on May 12, 2013] URL: http://en.wikipedia.org/wiki/Polynomial_regression, Jul. 24, 2010, 4 pgs.
Pilu,M., et al., Training PDMs on models: The Case of Deformable Superellipses, Proceedings of the 7th British Machine Vision Conference, Edinburgh, Scotland, 1996, pp. 373-382, [online] [retrieved on Feb. 28, 2011] URL: https://docs.google.com/viewera=v&pid=explorer&chrome=true&srcid=0BxWzm3JBPnPmNDI1MDIxZGUtNGZhZi00NzJhLWFhZDMtNTJmYmRiMWYyMjBh&authkey=CPeVx4wO&hl=en.

Osian, M., et. al., Fitting Superellipses to Incomplete Contours, IEEE Computer Society Conference on Computer Vision and Pattern Recognition Workshops (CVPRW '04), Jun. 2004, 8 pgs.
Hough transform, [online] [retrieved on Feb. 13, 2010] URL: http://en.wikipedia.org/wiki/Hough_transform, Feb. 13, 2010, 7 pgs.
Tactile Pressure Measurement, Pressure Mapping Systems, and Force Sensors and Measurement Systems, [online] [retrieved on Aug. 6, 2013] URL: http://www.tekscan.com, 2 pgs.
Tactile Surface Pressure and Force Sensors,Sensor Products LLC, Oct. 26, 2006, [online] [retrieved on Aug. 6, 2013] URL: http://www.sensorprod.com, 2 pgs.
Pressure Profile Systems, Jan. 29, 2011, [online] [retrieved on Jan. 29, 2011] URL: http://www.pressureprofile.com, 1 pg.
Xsensor Technology Corporation, Feb. 7, 2011, [online] [retrieved on May 12, 2013] URL: http://www.xsensor.com, 1 pg.
Balda AG, Feb. 26, 2011, [online] [retrieved on May 12, 2013] URL: http://www.balda.de, 1 pg.
Cypress Semiconductor, Feb. 28, 2011, [online] [retrieved on May 12, 2013] URL: http://www.cypress.com, 1 pg.
Synaptics, Jan. 28, 2011, [online] [retrieved on May 12, 2013] URL: http://www.synaptics.com, 1 pg.
Venolia, D., et al., T-Cube: A Fast, Self-Disclosing Pen-Based Alphabet, CHI '94 Proceedings of the SIGCHI Conference on Human Factors in Computing Systems, Apr. 24-28, 1994, pp. 265-270.
Davis, R. C., et al., NotePals: Lightweight Note Taking by the Group, for the Group, University of California, Berkeley, Computer Science Division, 1998, 8 pgs.
Rekimoto, Jun, Pick-and-Drop: A Direct Manipulation Technique for Multiple Computer Environments, Sony Computer Science Laboratory Inc., Tokyo, Japan, 1997, [online] [retrieved on May 30, 2013] URL: http://www.sonycsl.co.jp/person/rekimoto/papers/uist97.pdf, 8 pgs.
Davis, R. C., et al., NotePals: Lightweight Note Sharing by the Group, for the Group, [online] [retrieved on Jun. 2, 2013] URL: http://dub.washington.edu:2007/projects/notepals/pubs/notepals-chi99-final.pdf, 9 pgs.
Want, R., et al., The PARCTAB ubiquitous computing experiment, 1995-1996, [online] [retrieved on Jun. 10, 2013] URL: http://www.ece.rutgers.edu/~parashar/Classes/02-03/ece572/perv-reading/the-parctab-ubiquitous-computing.pdf, 44 pgs.

* cited by examiner

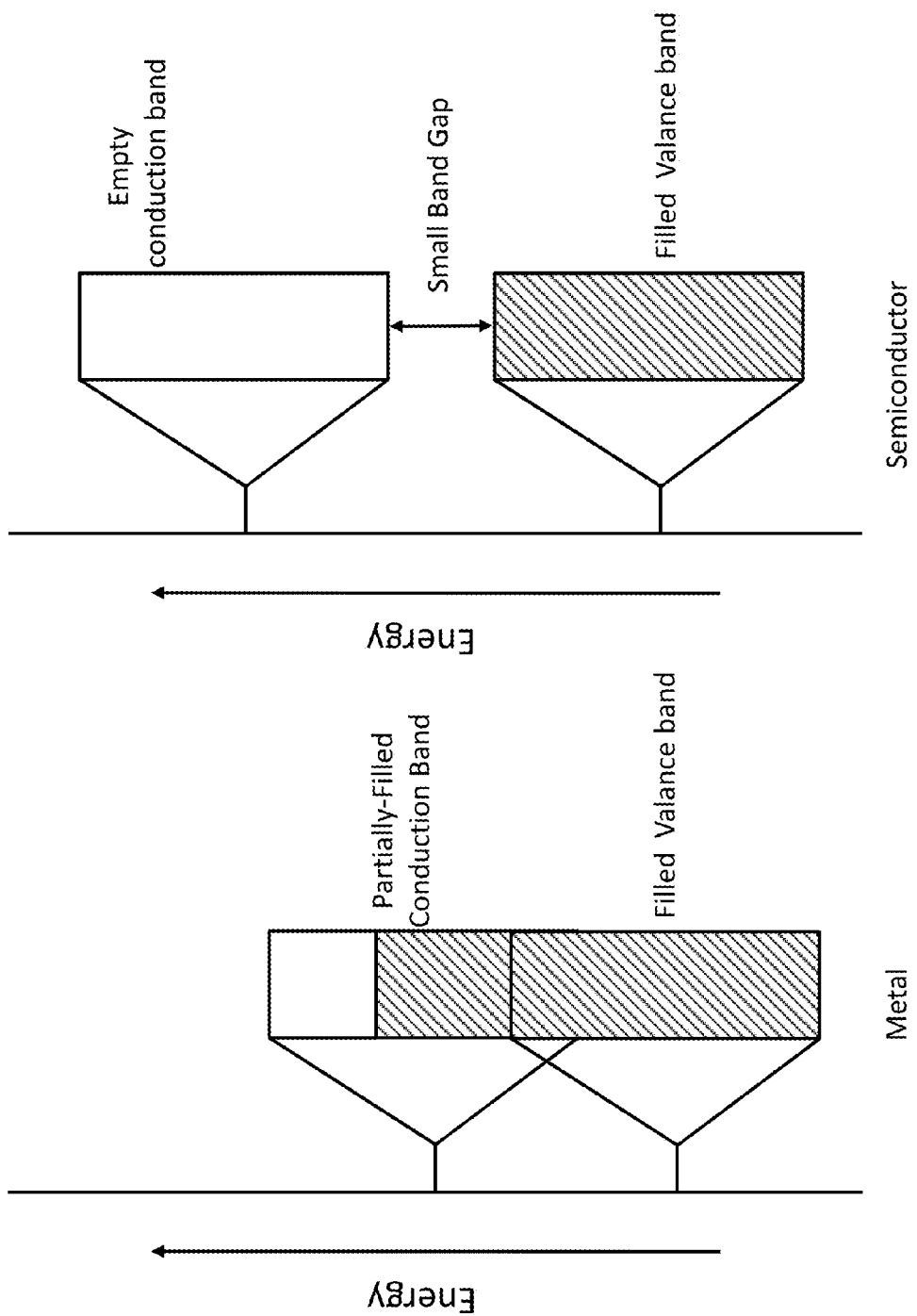

Adapted from http://en.wikipedia.org/wiki/Electronic_band_structure
(Pieter Kuiper) (visited 03/22/11)

From http://en.wikipedia.org/wiki/Band_gap (Pieter Kuiper) (visited 03/22/11)

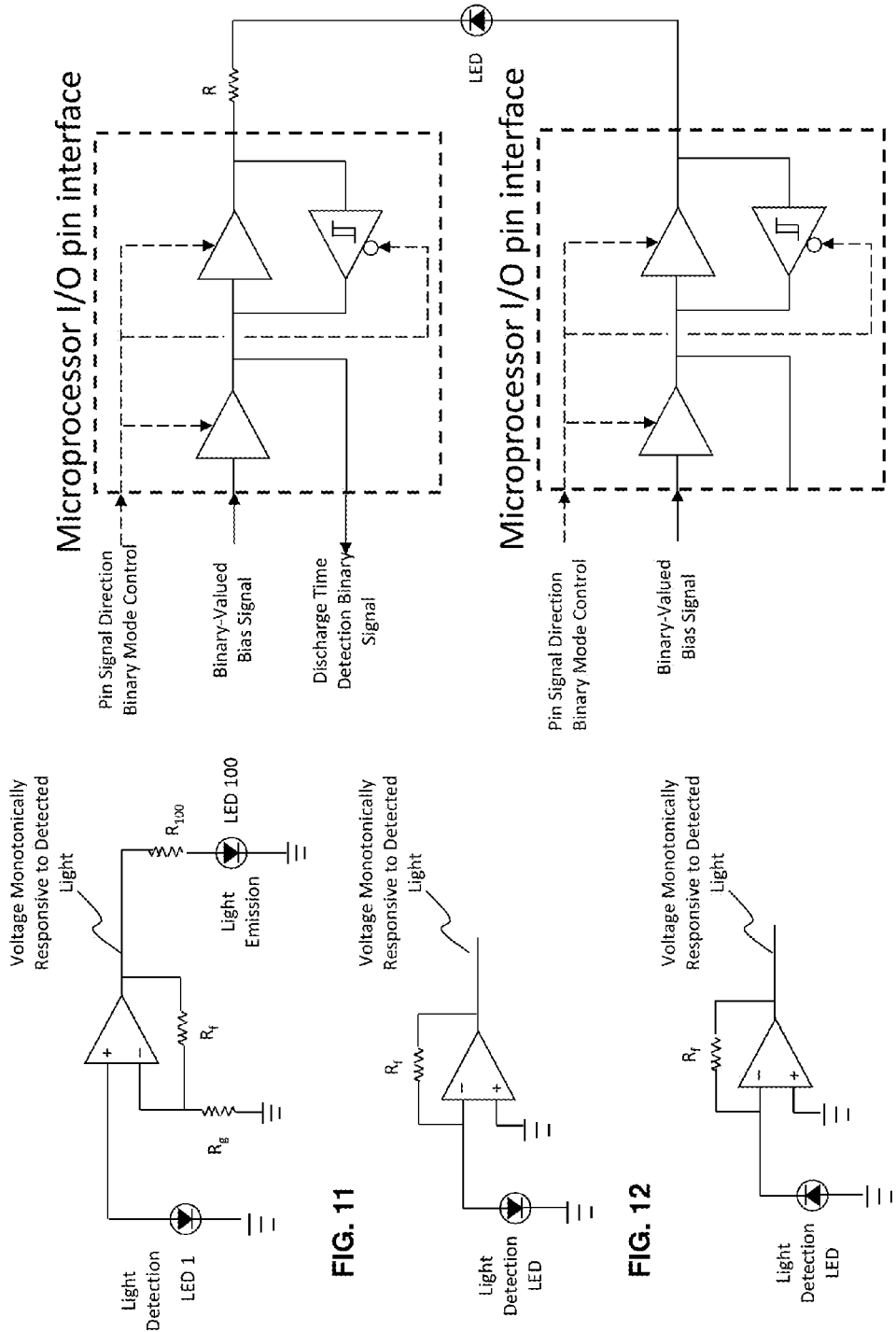

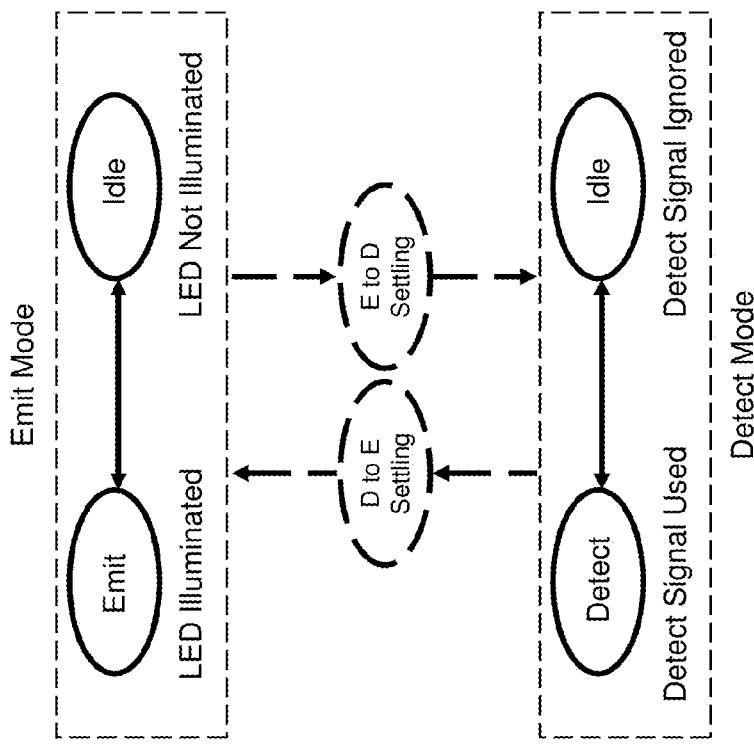
FIG. 26
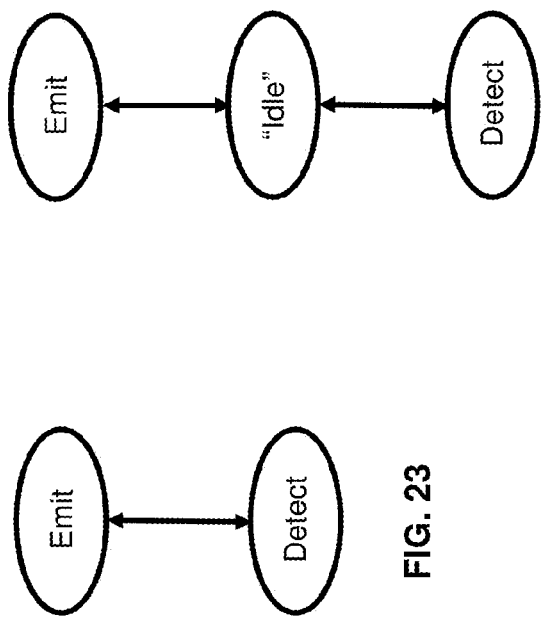
FIG. 23
FIG. 24
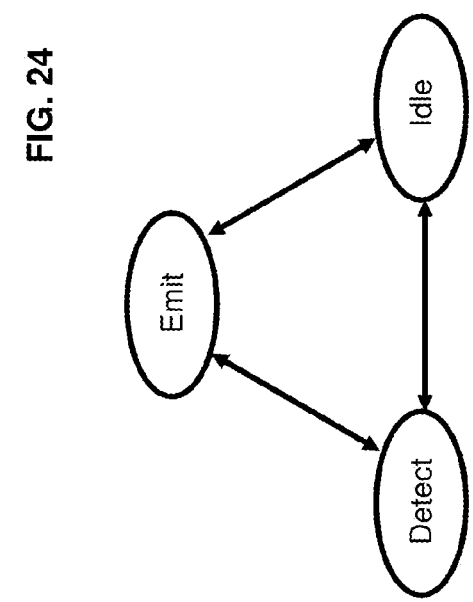
FIG. 25

Adapted from G. Gu, G. Parthasarathy, P. Burrows, T. Tian, I. Hill, A. Kahn, S. Forrest, "Transparent stacked organic light emitting devices. I. Design principles and transparent compound electrodes," *Journal of Applied Physics*, October 1999, vol. 86 no. 8, pp.4067-4075.

*These adapted from http://www.displayblog.com/2009/03/26/samsung-oled-pentile-matrix-next-iphone-oled-display/ (visited 03/23/11)*

Conventional RGB Stripe Arrangement (4 pixel span)

Legend:
Red
Green
Blue

PenTile Matrix™

(4 pixel span) 33% fewer subpixels

Legend:
Red
Green
Blue

USE OF LED OR OLED ARRAY TO IMPLEMENT INTEGRATED COMBINATIONS OF TOUCH SCREEN TACTILE, TOUCH GESTURE SENSOR, COLOR IMAGE DISPLAY, HAND-IMAGE GESTURE SENSOR, DOCUMENT SCANNER, SECURE OPTICAL DATA EXCHANGE, AND FINGERPRINT PROCESSING CAPABILITIES

CROSS-REFERENCE TO RELATED APPLICATIONS

This application is a continuation-in-part of U.S. application Ser. No. 13/180,345, filed Jul. 11, 2011, which claims benefit of priority from U.S. Provisional Application Ser. No. 61/363,181, filed Jul. 9, 2010, the contents of which are incorporated herein by reference.

COPYRIGHT & TRADEMARK NOTICES

Certain marks referenced herein may be common law or registered trademarks of the applicant, the assignee or third parties affiliated or unaffiliated with the applicant or the assignee. Use of these marks is for providing an enabling disclosure by way of example and shall not be construed to exclusively limit the scope of the disclosed subject matter to material associated with such marks.

BACKGROUND OF THE INVENTION

Throughout the discussion, although "OLED" is in places called out specifically, an "Organic Light Emitting Diode" (OLED) is regarded as a type of "Light Emitting Diode" (LED). The term "inorganic-LED" is used to specifically signify traditional LEDs made of non-organic materials such as silicon, indium-phosphide, etc. FIG. 1 depicts a visual classification representation showing inorganic-LEDs and Organic Light Emitting Diodes (OLEDs) as mutually-exclusive types of Light Emitting Diodes (LEDs).

Color inorganic-LED array displays are currently employed in "LED TV" products and road-side and arena color-image LED advertising signs.

Color OLED array displays have begun to appear in cellphones, smartphones, and Personal Digital Assistants ("PDAs") manufactured by Samsung, Nokia, LG, HTC, Phillips, Sony and others. Color OLED array displays are of particular interest, in general and as pertaining to the present invention, because:

They can be fabricated (along with associated electrical wiring conductors) via printed electronics on a wide variety of surfaces such as glass, Mylar, plastics, paper, etc.;

Leveraging some such surface materials, they can be readily bent, printed on curved surfaces, etc.;

They can be transparent (and be interconnected with transparent conductors);

Leveraging such transparency, they can be:
  Stacked vertically,
  Used as an overlay element atop an LCD or other display,
  Used as an underlay element between an LCD and its associated backlight.

LEDs as Light Sensors

Light detection is typically performed by photosite CCD (charge-coupled device) elements, phototransistors, CMOS photodetectors, and photodiodes. Photodiodes are often viewed as the simplest and most primitive of these, and typically comprise a PIN (P-type/Intrinstic/N-type) junction rather than the more abrupt PIN (P-type/N-type) junction of conventional signal and rectifying diodes.

However, virtually all diodes are capable of photovoltaic properties to some extent. In particular, LEDs, which are diodes that have been structured and doped specific types of optimized light emission, can also behave as (at least low-to moderate performance) photodiodes. In popular circles Forrest M. Mims has often been credited as calling attention to the fact that that a conventional LED can be used as a photovoltaic light detector as well as a light emitter (Mims III, Forrest M. "Sun Photometer with Light-emitting diodes as spectrally selective detectors" *Applied Optics*, Vol. 31, No. 33, Nov. 20, 1992), and as a photodetector LEDs exhibit spectral selectivity associated with the LED's emission wavelength. More generally, inorganic-LEDs, organic LEDs ("OLEDs"), organic field effect transistors, and other related devices exhibit a range of readily measurable photo-responsive electrical properties, such as photocurrents and related photovoltages and accumulations of charge in the junction capacitance of the LED.

Further, the relation between the spectral detection band and the spectral emission bands of each of a plurality of colors and types of color inorganic-LEDs, OLEDs, and related devices can be used to create a color light-field sensor from, for example, a color inorganic-LED, OLED, and related device array display. Such arrangements have been described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454. The present invention expands further upon this.

Pending U.S. patent application Ser. No. 12/419,229 (priority date Jan. 27, 1999), Ser. No. 12/471,275 (priority date May 25, 2008), U.S. Ser. No. 13/072,588, and U.S. 61/517,454 additionally teaches how such a light-field sensor can be used together with signal processing software to create lensless-imaging camera technology, and how such technology can be used to create an integrated camera/display device which can be used, for example, to deliver precise eye-contact in video conferencing applications.

In an embodiment provided for by the invention, each LED in an array of LEDs can be alternately used as a photodetector or as a light emitter. At any one time, each individual LED would be in one of three states:
  A light emission state,
  A light detection state,
  An idle state.

as may be advantageous for various operating strategies. The state transitions of each LED may be coordinated in a wide variety of ways to afford various multiplexing, signal distribution, and signal gathering schemes as may be advantageous.

Leveraging this in various ways, in accordance with embodiments of the invention, array of inorganic-LEDs, OLEDs, or related optoelectronic devices is configured to perform functions of two or more of:
  a visual image display (graphics, image, video, GUI, etc.),
  a (lensless imaging) camera,
  a tactile user interface (touch screen),
  a proximate gesture user interface.

These arrangements further advantageously allow for a common processor to be used for two or more display, user interface, and camera functionalities.

The result dramatically decreases the component count, system hardware complexity, and inter-chip communications complexity for contemporary and future mobile devices such as cellphones, smartphones, PDAs, tablet computers, and other such devices.

In cases where a user interface is incorporated, the RF capacitive matrix arrangements used in contemporary multi-touch touchscreen are replaced with an optical interface.

Further, the integrated camera/display operation removes the need for a screen-direction camera and interface electronics in mobile devices. The integrated camera/display operation can also improve eye contact in mobile devices.

SUMMARY OF THE INVENTION

For purposes of summarizing, certain aspects, advantages, and novel features are described herein. Not all such advantages may be achieved in accordance with any one particular embodiment. Thus, the disclosed subject matter may be embodied or carried out in a manner that achieves or optimizes one advantage or group of advantages without achieving all advantages as may be taught or suggested herein.

In accordance with embodiments of the invention, a system is taught for implementing a display which also serves as one or more of a tactile user interface touchscreen, light field sensor, proximate hand gesture sensor, and lensless imaging camera. In an implementation, an OLED array can be used for light sensing as well as light emission functions. In one implementation a single OLED array is used as the only optoelectronic user interface element in the system. In another implementation two OLED arrays are used, each performing and/or optimized from different functions. In another implementation, an LCD and an OLED array are used in various configurations. The resulting arrangements allow for sharing of both optoelectric devices as well as associated electronics and computational processors, and are accordingly advantageous for use in handheld devices such as cellphone, smartphones, PDAs, tablet computers, and other such devices.

In accordance with embodiments of the invention, array of inorganic-LEDs, OLEDs, or related optoelectronic devices is configured to perform functions of a display, a camera, and a hand-operated user interface sensor.

In an embodiment, an array of inorganic-LEDs, OLEDs, or related devices, together with associated signal processing aspects of the invention, can be used to implement a tactile user interface.

In an embodiment, an array of inorganic-LEDs, OLEDs, or related devices, together with associated signal processing aspects of the invention, can be adapted to function as both an image display and light-field sensor which can be used to implement a proximate image user interface.

In an embodiment, an array of inorganic-LEDs, OLEDs, or related devices, together with associated signal processing aspects of the invention, can be adapted to function as both an image display and light-field sensor which can be used to implement a tactile user interface sensor.

In an embodiment, an array of inorganic-LEDs, OLEDs, or related devices, together with associated signal processing aspects of the invention, can be adapted to function as both an image display and light-field sensor which can be used to implement a proximate image user interface sensor.

In an embodiment, an array of inorganic-LEDs, OLEDs, or related devices, together with associated signal processing aspects of the invention, can be adapted to function as both an image display and light-field sensor which can be used to implement a tactile user interface (touch screen), lensless imaging camera, and visual image display.

In an embodiment, an array of inorganic-LEDs, OLEDs, or related devices, together with associated signal processing aspects of the invention, can be adapted to function as both an image display and light-field sensor which can be used to implement a proximate gesture user interface, lensless imaging camera, and visual image display.

In an embodiment, an array of inorganic-LEDs, OLEDs, or related devices, together with associated signal processing aspects of the invention, can be adapted to function as both an image display and light-field sensor which can be used to implement a proximate gesture user interface, tactile user interface (touch screen), lensless imaging camera, and visual image display.

In accordance with embodiments of the invention, a system for implementing the function of a visual display, light field sensor, and a user interface for operated by a user hand is taught, the system comprising:
  A processor, the processor having an electrical interface and for executing at least one software algorithm;
  A transparent OLED array comprising at least a plurality of OLEDs, the OLED array configured to be in communication with the electrical interface of the processor;
  An optical vignetting arrangement for providing a plurality of distinct vignettes of an incoming light field, and
  A light emitting arrangement associated with the transparent OLED array, the light emitting arrangement for providing a visual display;
  Wherein each distinct vignette of the incoming light field is directed to an associated individual OLED from the plurality of OLEDs;
  Wherein each of the individual OLED performs a light detection function at least for an interval of time, the light detection function comprising a photoelectric effect that is communicated to the processor via the electrical interface of the processor; and
  Wherein the photoelectric effect that is communicated to the processor is used to obtain light field measurement information responsive to the incoming light field.

BRIEF DESCRIPTION OF THE DRAWINGS

The above and other aspects, features and advantages of the present invention will become more apparent upon consideration of the following description of preferred embodiments taken in conjunction with the accompanying drawing figures, wherein:

FIG. 3 depicts an example electron energy distribution for metals, (wherein the filled valance band overlaps with the conduction band).

FIG. 4 depicts an example electron energy distribution for semiconductors (wherein the filled valance band is separated from the conduction band by a gap in energy values; this gap is the "band gap").

FIGS. 11-14 depict various exemplary circuits demonstrating various exemplary approaches to detecting light with an LED.

FIGS. 23-26 depict exemplary state diagrams for the operation of the LED and the use of input signals and output signals.

DETAILED DESCRIPTION

The above and other aspects, features and advantages of the present invention will become more apparent upon consideration of the following description of preferred embodiments taken in conjunction with the accompanying drawing figures.

In the following description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention.

Inorganic and Organic Semiconductors

Figure 2:
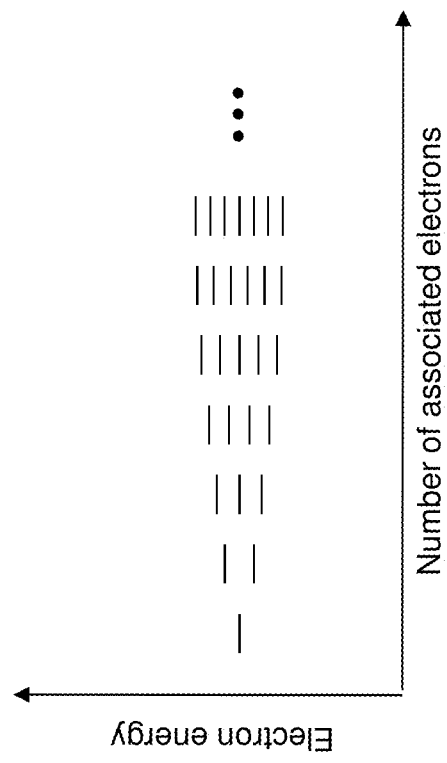
FIG. 2 depicts a representation of the spread of electron energy levels as a function of the number of associated electrons in a system such as a lattice of semiconducting material resultant from quantum state exclusion processes. (The relative positions vertically and from column-to-column are schematic and not to scale, and electron pairing effects are not accurately represented.)

FIG. 2 depicts a representation of the spread of electron energy levels as a function of the number of associated electrons in a system such as a lattice of semiconducting material resultant from quantum state exclusion processes. As the number of associated electrons in a system increases, the separation between consecutive energy levels decreases, in the limit becoming an effective continuum of energy levels. Higher energy level electrons form a conduction band while lower energy electrons lie in a valence band. The relative positions vertically and from column-to-column are schematic and not to scale, and electron pairing effects are not accurately represented.

FIG. 3 depicts an example electron energy distribution for metals, (wherein the filled valance band overlaps with the conduction band).

FIG. 4 depicts an example electron energy distribution for semiconductors; here the filled valance band is separated from the conduction band by a gap in energy values. The "band gap" is the difference in energy between electrons at the top of the valence band and electrons at the bottom of the conduction band. For a semiconductor the band gap is small, and manipulations of materials, physical configurations, charge and potential differences, photon absorption, etc. can be used to move electrons through the band gap or along the conduction band.

Figure 5:
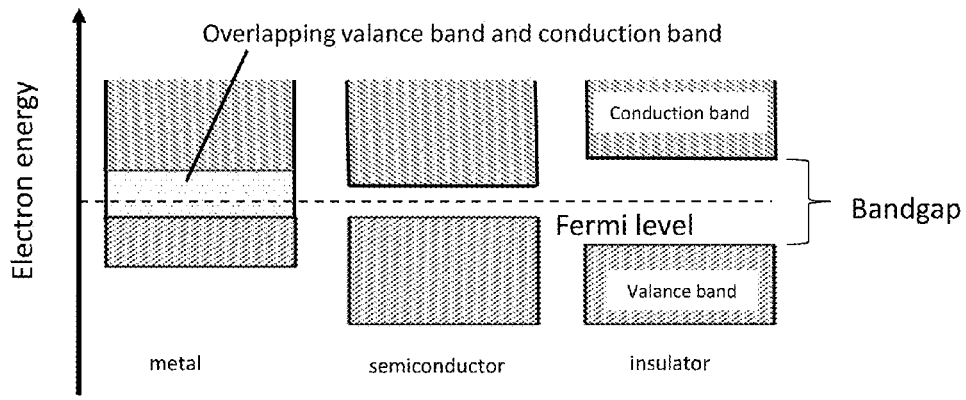
FIG. 5 depicts an exemplary (albeit not comprehensive) schematic representation of the relationships between valance bands and conduction bands in materials distinctly classified as metals, semiconductors, and insulators. (Adapted from Pieter Kuiper, http://en.wikipedia.org/wiki/Electronic_band_structure, visited Mar. 22, 2011.)

Elaborating further, FIG. 5 (adapted from Pieter Kuiper, http://en.wikipedia.org/wiki/Electronic_band_structure, visited Mar. 22, 2011) depicts an exemplary (albeit not comprehensive) schematic representation of the relationships between valance bands and conduction bands in materials distinctly classified as metals, semiconductors, and insulators. The band gap is a major factor determining the electrical conductivity of a material. Although metal conductor materials are shown having overlapping valance and conduction bands, there are some conductors that instead have very small band gaps. Materials with somewhat larger band gaps are electrical semiconductors, while materials with very large band gaps are electrical insulators.

Figure 1:
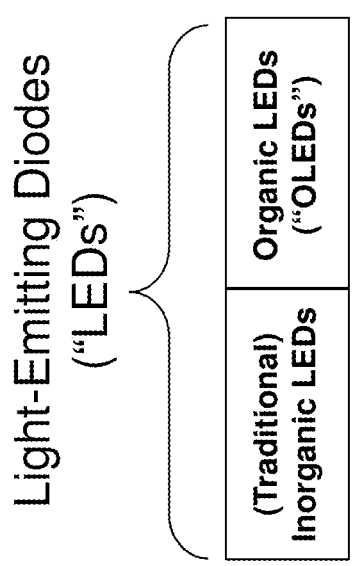
FIG. 1 depicts a visual classification representation showing inorganic-LEDs and Organic Light Emitting Diodes (OLEDs) as mutually-exclusive types of Light Emitting Diodes (LEDs).
Figure 6:
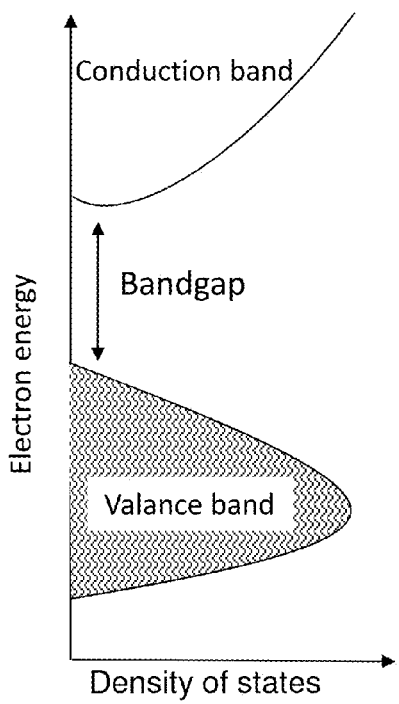
FIG. 6 depicts the how the energy distribution of electrons in the valance band and conduction band vary as a function of the density of electron states, and the resultant growth of the band gap as the density of electron states increases. (Adapted from Pieter Kuiper, http://en.wikipedia.org/wiki/Band_gap, visited Mar. 22, 2011.)

The affairs shown in FIG. 1 and FIG. 4 are related. FIG. 6 (adapted from Pieter Kuiper, http://en.wikipedia.org/wiki/Band_gap, visited Mar. 22, 2011) depicts how the energy distribution of electrons in the valance band and conduction band vary as a function of the density of assumed electron states per unit of energy, illustrating growth of the size of the band gap as the density of states (horizontal axis) increases.

Light Sensing by Photodiodes and LEDs

Electrons can move between the valence band and the conduction band by means of special processes that give rise to hole-electron generation and hole-electron recombination. Several such processes are related to the absorption and emission of photons which make up light.

Figure 7:
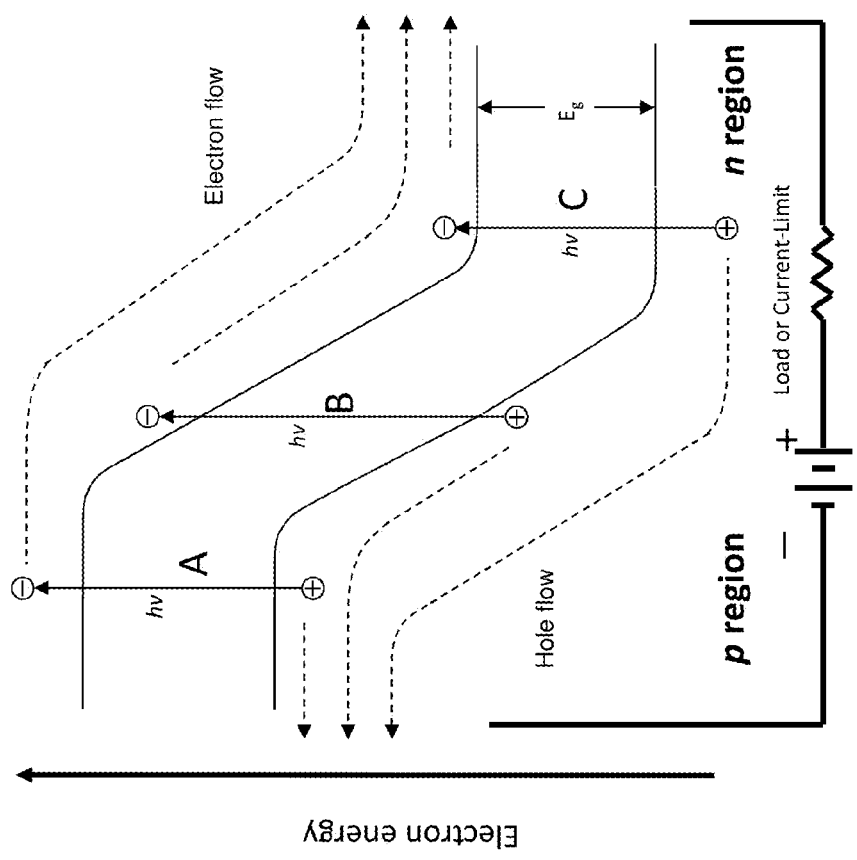
FIG. 7 depicts three exemplary types of electron-hole creation processes resulting from absorbed photons that contribute to current flow in a PN diode (adapted from A. Yariv, *Optical Electronics,* 4th edition, Saunders College Press, 1991, p. 423).

Light detection in information systems is typically performed by photosite CCD (charge-coupled device) elements, phototransistors, CMOS photodetectors, and photodiodes. By way of example, FIG. 7 (adapted from A. Yariv, —*Optical Electronics,* 4th edition, Saunders College Press, 1991, p. 423) depicts three exemplary types of electron-hole creation processes resulting from absorbed photons that contribute to current flow in a PN diode. Emitted photons cause electrons to drop through the band gap while absorbed photons of sufficient energy can excite electrons from the valance band though the band gap to the conduction band.

Photodiodes are often viewed as the simplest and most primitive form of semiconductor light detector. A photodiode typically comprises a PIN (P-type/Intrinsic/N-type) junction rather than the more abrupt PIN (P-type/N-type) junction of conventional signal and rectifying diodes. However, photoelectric effects and capabilities are hardly restricted to PIN diode structures. In varying degrees, virtually all diodes are capable of photovoltaic properties to some extent.

In particular, LEDs, which are diodes that have been structured and doped for specific types of optimized light emission, can also behave as (at least low-to-medium performance) photodiodes. Additionally, LEDs also exhibit other readily measurable photo-responsive electrical properties, such as photodiode-type photocurrents and related accumulations of charge in the junction capacitance of the LED. In popular circles Forrest M. Mims has often been credited as calling attention to the fact that that a conventional LED can be used as a photovoltaic light detector as well as a light emitter (Mims III, Forrest M. "Sun Photometer with Light-emitting diodes as spectrally selective detectors" *Applied Optics,* Vol. 31, No. 33, Nov. 20, 1992). More generally LEDs, organic LEDs ("OLEDs"), organic field effect transistors, and other related devices exhibit a range of readily measurable photo-responsive electrical properties, such as photocurrents and related photovoltages and accumulations of charge in the junction capacitance of the LED.

In an LED, light is emitted when holes and carriers recombine and the photons emitted have an energy in a small range either side of the energy span of the band gap. Through engineering of the band gap, the wavelength of light emitted by an LED can be controlled. In the aforementioned article, Mims additionally pointed out that as a photodetector LEDs exhibit spectral selectivity with at a light absorption wavelength similar to that of the LED's emission wavelength. More details as to the spectral selectivity of the photoelectric response of an LED will be provided later.

Attention is now directed to organic semiconductors and their electrical and optoelectrical behavior. Conjugated organic compounds comprise alternating single and double bonds in the local molecular topology comprising at least some individual atoms (usually carbon, but can be other types of atoms) in the molecule. The resulting electric fields organize the orbitals of those atoms into a hybrid formation comprising a σ bond (which engage electrons in forming the molecular structure among joined molecules) and a π cloud of loosely associated electrons that are in fact delocalized and can move more freely within the molecule. These delocalized π electrons provide a means for charge transport within the molecule and electric current within larger-structures of organic materials (for example, polymers).

Figure 8:
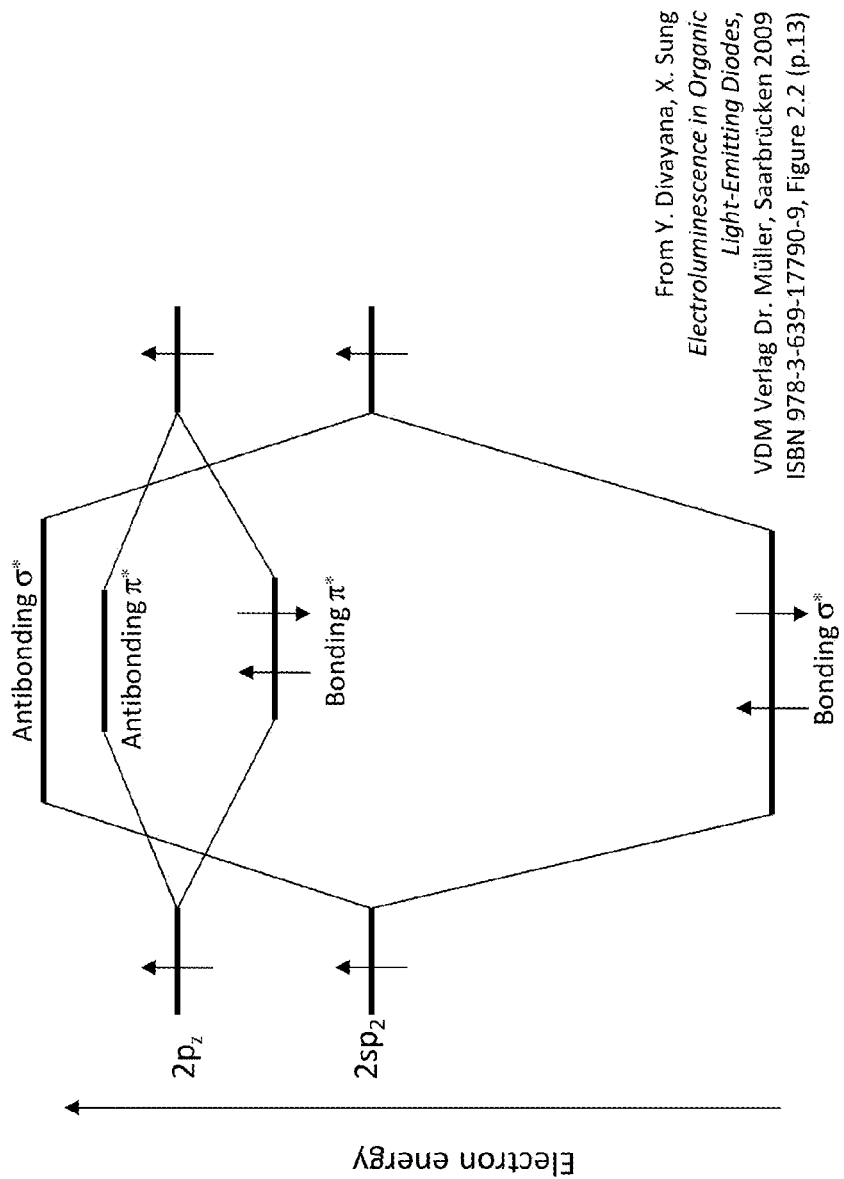
FIG. 8 depicts exemplary electron energy distribution among bonding and antibonding molecular orbitals in conjugated or aromatic organic compounds (adapted from Y. Divayana, X. Sung, *Electroluminescence in Organic Light-Emitting Diodes*, VDM Verlag Dr. Müller, Saarbrücken, 2009, ISBN 978-3-639-17790-9, FIG. 2.2, p. 13).

Combinations of atomic orbital modalities for the individual atoms in a molecule, together with the molecular topology (created by the σ bonds) and molecular geometry, create molecule-scale orbitals for the delocalized π cloud of electrons and in a sense for the electrons comprising σ bonds. Interactions among the electrons, in particular quantum exclusion processes, create an energy gap between the Highest Occupied Molecular Orbital ("HOMO") and Lowest-Unoccupied Molecular Orbital ("LUMO") for the delocalized π electrons (and similarly does so for the more highly localized σ bond electrons). FIG. 8 (adapted from Y. Divayana, X. Sung, *Electroluminescence in Organic Light-Emitting Diodes*, VDM Verlag Dr. Müller, Saarbrücken, 2009, ISBN 978-3-639-17790-9, FIG. 2.2, p. 13) depicts the electron energy distribution among bonding (π and σ) and antibonding (π* and σ*) molecular orbitals in for two electrons in an exemplary conjugated or aromatic organic compound. In such materials typically the energy gap between the π and π* molecular orbitals correspond to the gap between the HOMO and LUMO. The HOMO effectively acts as a valence band in a traditional (inorganic) crystal lattice semiconductor and the LUMO acts as effective equivalent to a conduction band. Accordingly, energy gap between the HOMO and LUMO (usually corresponding to the gap between the π and π* molecular orbitals) behaves in a manner similar to the band gap in a crystal lattice semiconductor and thus permits many aromatic organic compounds to serve as electrical semiconductors.

Emitted photons cause electrons to drop through the HOMO/LUMO gap while absorbed photons of sufficient energy can excite electrons from the HOMO to the LUMO. These processes are similar to photon emission and photo absorption processes in a crystal lattice semiconductor and can be used to implement organic LED ("OLED") and organic photodiode effects with aromatic organic compounds. Functional groups and other factors can vary the width of the band gap so that it matches energy transitions associated with selected colors of visual light. Additional details on organic LED ("OLED") processes, materials, operation, fabrication, performance, and applications can be found in, for example:

Z. Li, H. Ming (eds.), *Organic Light-Emitting Materials and Devices*, CRC Taylor & Francis, Boca Raton, 2007, ISBN 1-57444-574-X;
Z. Kafafi (ed.), *Organic Electroluminescence*, CRC Taylor & Francis, Boca Raton, 2005, ISBN 0-8247-5906-0;
Y. Divayana, X. Sung, *Electroluminescence in Organic Light-Emitting Diodes*, VDM Verlag Dr. Müller, Saarbrücken, 2009, ISBN 978-3-639-17790-9.

It is noted that an emerging alternative to OLEDs are Organic Light Emitting Transistors (OLETS). The present invention allows for arrangements employing OLETS to be employed in place of OLEDs and LEDs as appropriate and advantageous wherever mentioned throughout the specification.

Figure 9:
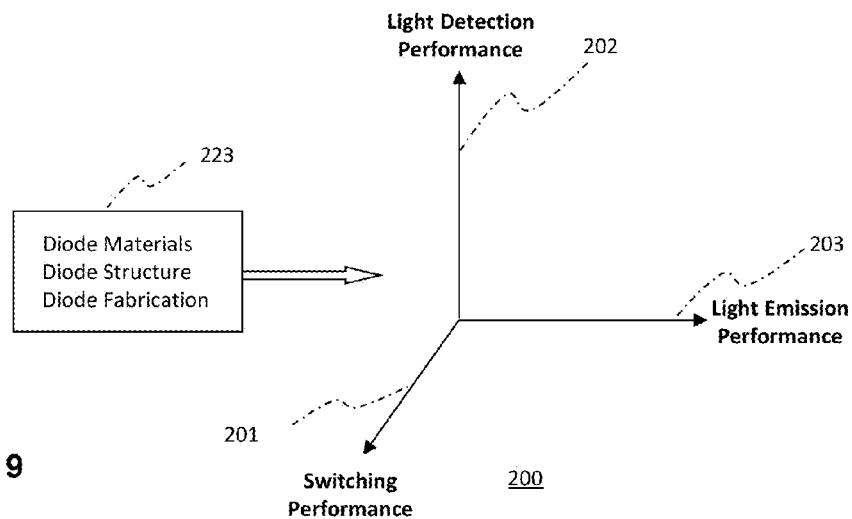
FIG. 9 depicts an optimization space for semiconductor diodes comprising attributes of signal switching performance, light emitting performance, and light detection performance.

Potential Co-Optimization of Light Sensing and Light Emitting Capabilities of an Optical Diode Element FIG. 9 depicts an optimization space 200 for semiconductor (traditional crystal lattice or organic material) diodes comprising attributes of signal switching performance, light emitting performance, and light detection performance. Specific diode materials, diode structure, and diode fabrication approaches 223 can be adjusted to optimize a resultant diode for switching function performance 201 (for example, via use of abrupt junctions), light detection performance 202 (for example via a P-I-N structure comprising a layer of intrinsic semiconducting material between regions of n-type and p-type material, or light detection performance 203.

Figure 10:
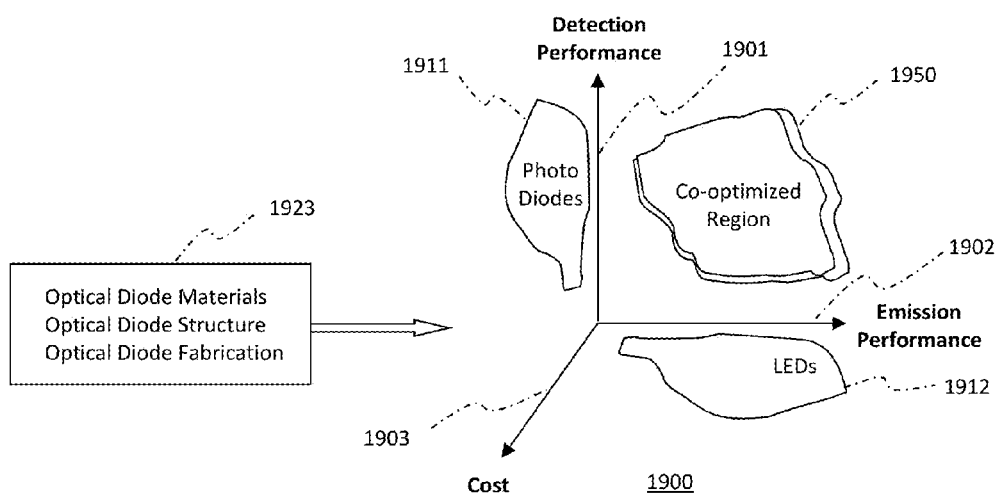
FIG. 10 depicts an exemplary metric space of device realizations for optoelectronic devices and regions of optimization and co-optimization.

FIG. 10 depicts an exemplary metric space 1900 of device realizations for optoelectronic devices and regions of optimization and co-optimization.

Specific optoelectrical diode materials, structure, and fabrication approaches 1923 can be adjusted to optimize a resultant optoelectrical diode for light detection performance 1901 (for example via a P-I-N structure comprising a layer of intrinsic semiconducting material between regions of n-type and p-type material versus light emission performance 1902 versus cost 1903. Optimization within the plane defined by light detection performance 1901 and cost 1903 traditionally result in photodiodes 1911 while optimization within the plane defined by light emission performance 1902 and cost 1903 traditionally result in LEDs 1912. The present invention provides for specific optoelectrical diode materials, structure, and fabrication approaches 1923 to be adjusted to co-optimize an optoelectrical diode for both good light detection performance 1901 and light emission performance 1902 versus cost 1903. A resulting co-optimized optoelectrical diode can be used for multiplexed light emission and light detection modes. These permit a number of applications as explained in the sections to follow.

Again it is noted that an emerging alternative to OLEDs are Organic Light Emitting Transistors (OLETS). The present invention allows for arrangements employing OLETS to be employed in place of OLEDs and LEDs as appropriate and advantageous wherever mentioned throughout the specification.

Electronic Circuit Interfacing to LEDs Used as Light Sensors

FIGS. 11-14 depict various exemplary circuits demonstrating various exemplary approaches to detecting light with an LED. These initially introduce the concepts of received light intensity measurement ("detection") and varying light emission intensity of an LED in terms of variations in D.C. ("direct-current") voltages and currents. However, light intensity measurement ("detection") can be accomplished by other means such as LED capacitance effects—for example reverse-biasing the LED to deposit a known charge, removing the reverse bias, and then measuring the time for the charge to then dissipate within the LED. Also, varying the light emission intensity of an LED can be accomplished by other means such as pulse-width-modulation—for example, a duty-cycle of 50% yields 50% of the "constant-on" brightness, a duty-cycle of 50% yields 50% of the "constant-on" brightness, etc. These, too, are provided for by the invention and will be considered again later as variations of the illustrative approaches provided below.

To begin, LED1 in FIG. 11 is employed as a photodiode, generating a voltage with respect to ground responsive to the intensity of the light received at the optically-exposed portion of the LED-structured semiconducting material. In particular, for at least a range of light intensity levels the voltage generated by LED1 increases monotonically with the received light intensity. This voltage can be amplified by a high-impedance amplifier, preferably with low offset currents. The example of FIG. 11 shows this amplification performed by a simple operational amplifier ("op amp") circuit with fractional negative feedback, the fraction determined via a voltage divider. The gain provided by this simple op amp arrangement can be readily recognized by one skilled in the art as $1+(R_f/R_g)$.

The op amp produces an isolated and amplified output voltage that increases, at least for a range, monotonically with increasing light received at the light detection LED 1. Further in this example illustrative circuit, the output voltage of the op amp is directed to LED100 via current-limiting resistor R100. The result is that the brightness of light emitted by LED100 varies with the level of light received by LED1.

For a simple lab demonstration of this rather remarkable fact, one can choose a TL08x series (TL082, TL084, etc.) or equivalent op amp powered by +12 and −12 volt split power supply, R100 of ~1KΩ, and $R_f/R_g$ in a ratio ranging from 1 to 20 depending on the type of LED chosen. LED100 will be dark when LED1 is engulfed in darkness and will be brightly lit when LED1 is exposed to natural levels of ambient room light. For best measurement studies, LED1 could comprise a "water-clear" plastic housing (rather than color-tinted). It should also be noted that the LED1 connection to the amplifier input is of relatively quite high impedance and as such can readily pick up AC fields, radio signals, etc. and is best realized using as physically small electrical surface area and length as possible. In a robust system, electromagnetic shielding is advantageous.

The demonstration circuit of FIG. 11 can be improved, modified, and adapted in various ways (for example, by adding voltage and/or current offsets, JFET preamplifiers, etc.), but as shown is sufficient to show that a wide range of conventional LEDs can serve as pixel sensors for an ambient-room light sensor array as can be used in a camera or other room-light imaging system. Additionally, LED100 shows the role an LED can play as a pixel emitter of light.

FIG. 12 shows a demonstration circuit for the photocurrent of the LED. For at least a range of light intensity levels the photocurrent generated by LED1 increases monotonically with the received light intensity. In this exemplary circuit the photocurrent is directed to a natively high-impedance op amp (for example, a FET input op amp such as the relatively well-known LF-351) set up as an inverting current-to-voltage converter. The magnitude of the transresistance (i.e., the current-to-voltage "gain") of this inverting current-to-voltage converter is set by the value of the feedback resistor Rf. The resultant circuit operates in a similar fashion to that of FIG. 11 in that the output voltage of the op amp increases, at least for a range, monotonically with increasing light received at the light detection LED. The inverting current-to-voltage converter inverts the sign of the voltage, and such inversion in sign can be corrected by a later amplification stage, used directly, or is preferred. In other situations it can be advantageous to not have the sign inversion, in which case the LED orientation in the circuit can be reversed, as shown in FIG. 13.

FIG. 14 shows an illustrative demonstration arrangement in which an LED can be for a very short duration of time reverse biased and then in a subsequent interval of time the resultant accumulations of charge in the junction capacitance of the LED are discharged. The decrease in charge during discharge through the resistor R results in a voltage that can be measured with respect to a predetermined voltage threshold, for example as can be provided by a (non-hysteretic) comparator or (hysteretic) Schmitt-trigger. The resulting variation in discharge time varies monotonically with the light received by the LED. The illustrative demonstration arrangement provided in FIG. 14 is further shown in the context of connects to the bidirectional I/O pin circuit for a conventional microprocessor. This permits the principal to be readily demonstrated through a simple software program operating on such a microprocessor. Additionally, as will be seen later, the very same circuit arrangement can be used to variably control the emitted light brightness of the LED by modulating the temporal pulse-width of a binary signal at one or both of the microprocessor pins.

Multiplexing Circuitry for LED Arrays

For rectangular arrays of LEDs, it is typically useful to interconnect each LED with access wiring arranged to be part of a corresponding matrix wiring arrangement. The matrix wiring arrangement is time-division multiplexed. Such time-division multiplexed arrangements can be used for delivering voltages and currents to selectively illuminate each individual LED at a specific intensity level (including very low or zero values so as to not illuminate).

Figure 15:
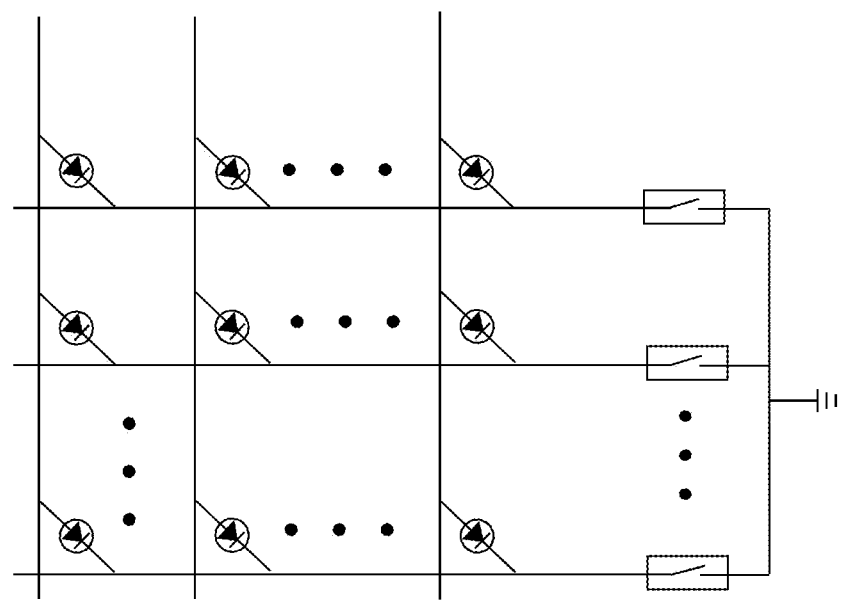
FIG. 15 depicts a selectable grounding capability for a two-dimensional array of LEDs.

An example multiplexing arrangement for a two-dimensional array of LEDs is depicted in FIG. 15. Here each of a plurality of normally-open analog switches are sequentially closed for brief disjointed intervals of time. This allows the selection of a particular subset (here, a column) of LEDs to be grounded while leaving all other LEDs in the array not connected to ground. Each of the horizontal lines then can be used to connect to exactly one grounded LED at a time. The plurality of normally-open analog switches in FIG. 15 may be controlled by an address decoder so that the selected subset can be associated with a unique binary address, as suggested in FIG. 16. The combination of the plurality of normally-open analog switches together with the address decoder form an analog line selector. By connecting the line decoder's address decoder input to a counter, the columns of the LED array can be sequentially scanned.

Figure 16:
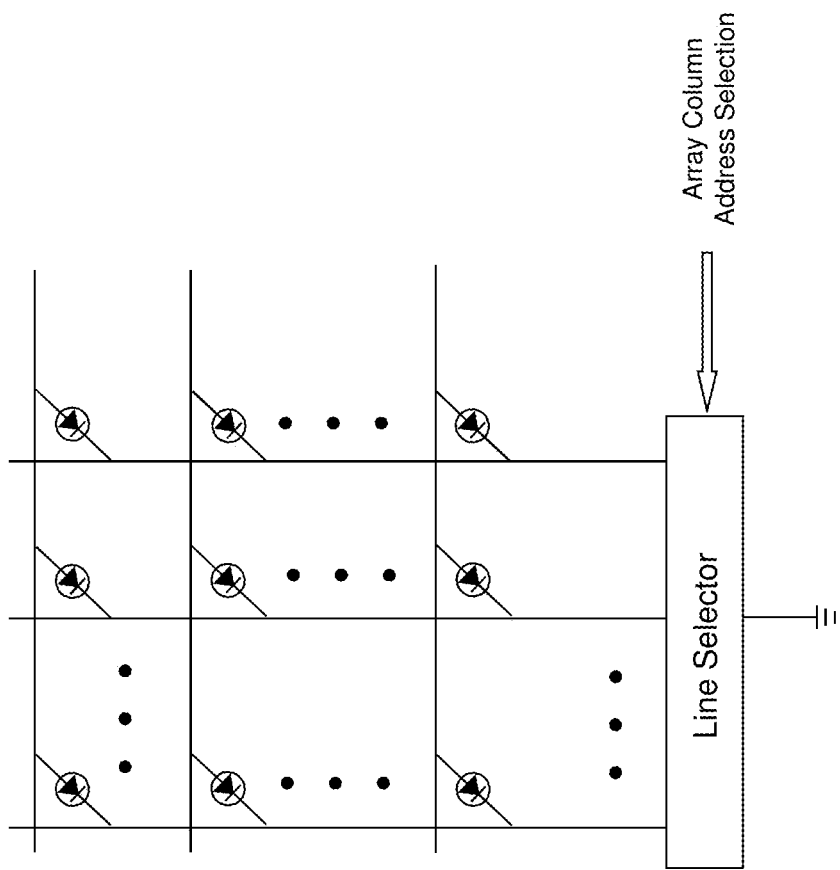
FIG. 16 depicts an adaptation of the arrangement depicted in FIG. 15 that is controlled by an address decoder so that the selected subset can be associated with a unique binary address.
Figure 17:
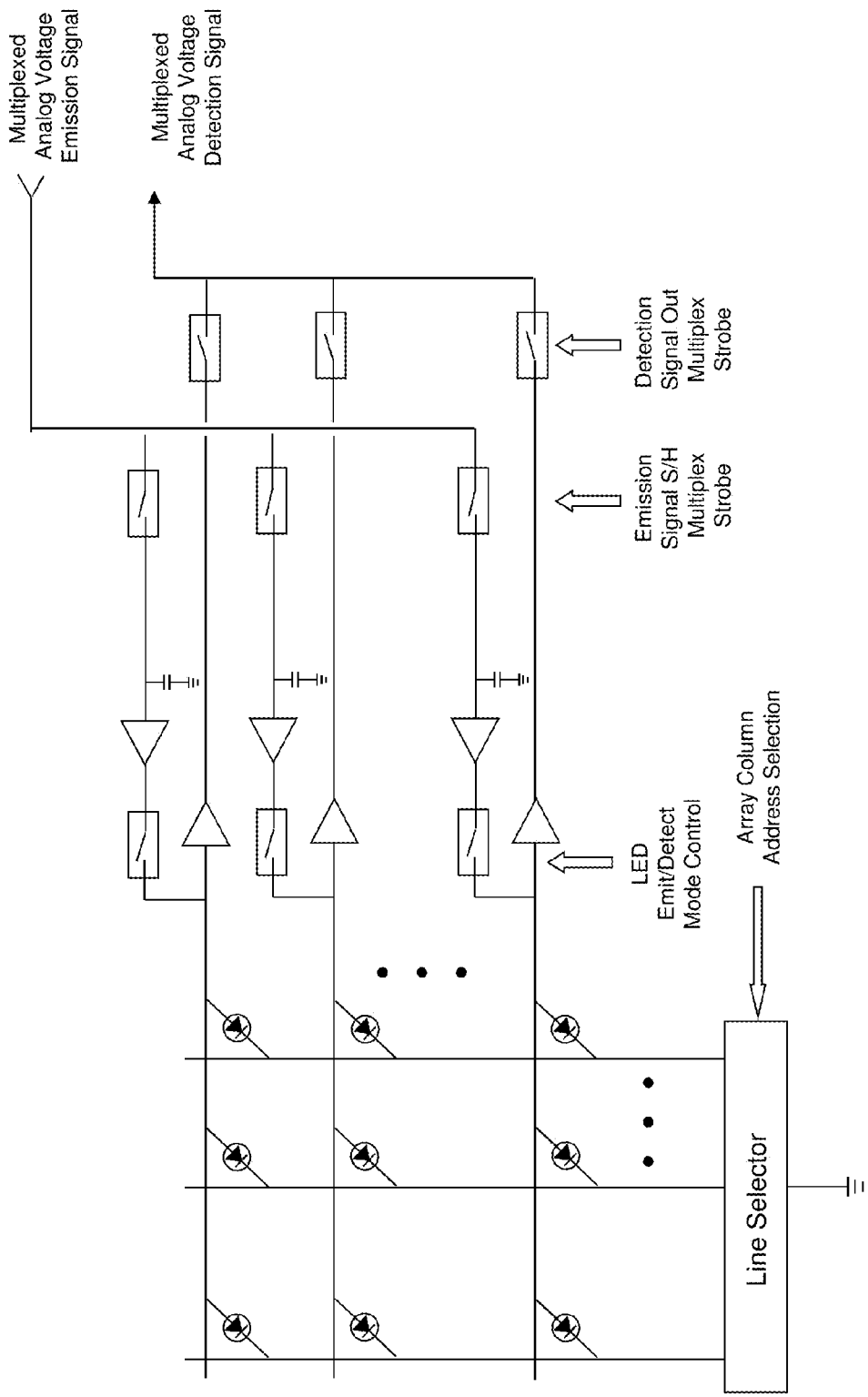
FIG. 17 depicts an exemplary highly-scalable electrically-multiplexed LED array display that also functions as a light field detector.

FIG. 17 depicts an exemplary adaptation of the arrangement of FIG. 16 together to form a highly scalable LED array display that also functions as a light field detector. The various multiplexing switches in this arrangement can be synchronized with the line selector and mode control signal so that each LED very briefly provides periodically updated detection measurement and is free to emit light the rest of the time. A wide range of variations and other possible implementations are possible and implemented in various products.

Figure 18:
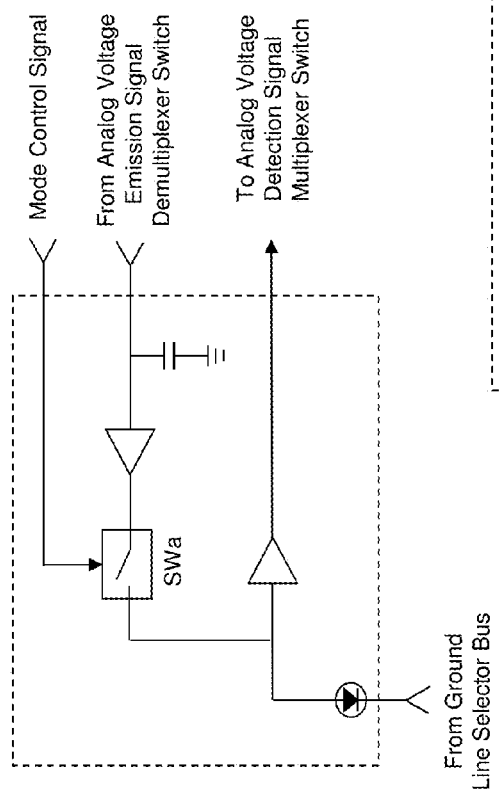
FIGS. 18 and 19 depict exemplary functional cells that may be used in a large scale array.
Figure 19:
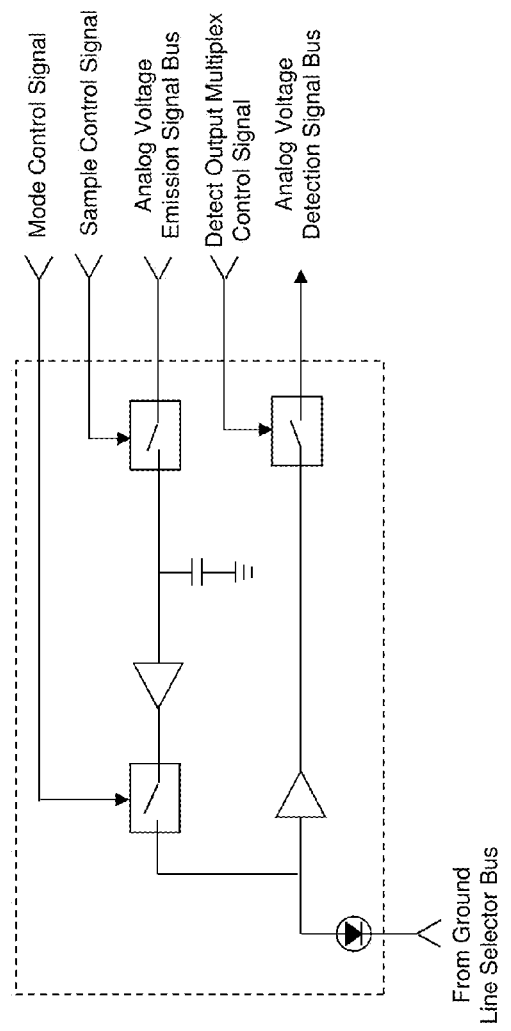

Such time-division multiplexed arrangements can alternatively be used for selectively measuring voltages or currents of each individual LED. Further, the illumination and measurement time-division multiplexed arrangements themselves can be time-division multiplexed, interleaved, or merged in various ways. As an illustrative example, the arrangement of FIG. 17 can be reorganized so that the LED, mode control switch, capacitor, and amplifiers are collocated, for example as in the illustrative exemplary arrangement of FIG. 18. Such an arrangement can be implemented with, for example, three MOSFET switching transistor configurations, two MOSFET amplifying transistor configurations, a small-area/small-volume capacitor, and an LED element (that is, five transistors, a small capacitor, and an LED). This can be treated as a cell which is interconnected to multiplexing switches and control logic. A wide range of variations and other possible implementations are possible and the example of FIG. 17 is in no way limiting. For example, the arrangement of FIG. 17 can be reorganized to decentralize the multiplexing structures so that the LED, mode control switch, multiplexing and sample/hold switches, capacitor, and amplifiers are collocated, for example as in the illustrative exemplary arrangement of FIG. 19. Such an arrangement can be implemented with, for example, three MOSFET switching transistor configurations, two MOSFET amplifying transistor configurations, a small-area/small-volume capacitor, and an LED element (that is, five transistors, a small capacitor, and an LED). This can be treated as a cell whose analog signals are directly interconnected to busses. Other arrangements are also possible.

The discussion and development thus far are based on the analog circuit measurement and display arrangement of FIG. 11 that in turn leverages the photovoltaic properties of LEDs. With minor modifications clear to one skilled in the art, the discussion and development thus far can be modified to operate based on the analog circuit measurement and display arrangements of FIG. 12 and FIG. 13 that leverage the photocurrrent properties of LEDs.

Figure 21:
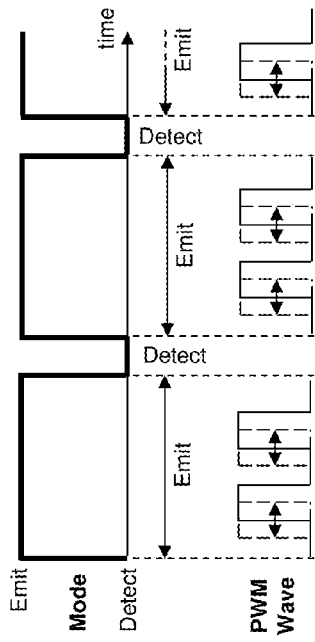
FIGS. 20-22 depict adaptations of the digital circuit measurement and display arrangements into an example combination.
Figure 22:
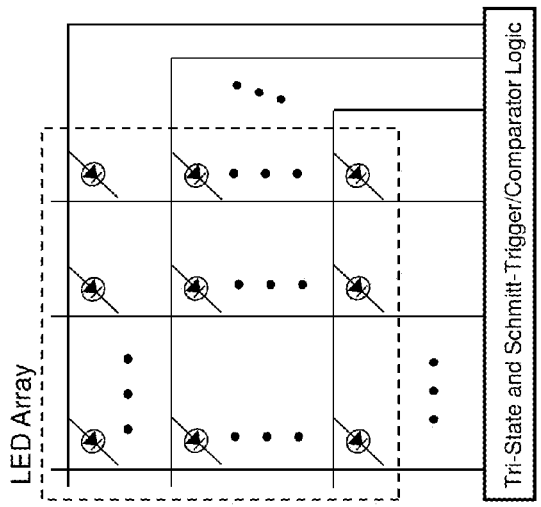
Figure 20:
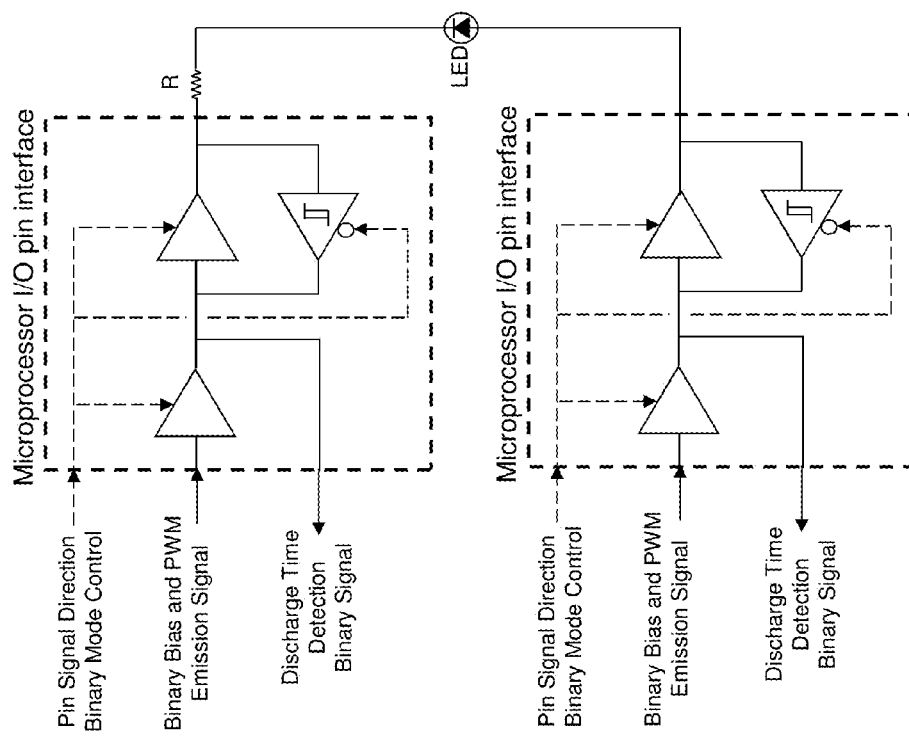

FIG. 20, FIG. 21, and FIG. 22 depict an example of how the digital circuit measurement and display arrangement of FIG. 14 (that in turn leverages discharge times for accumulations of photo-induced charge in the junction capacitance of the LED) can be adapted into the construction developed thus far. FIG. 20 adapts FIG. 14 to additional include provisions for illuminating the LED with a pulse-modulated emission signal. Noting that the detection process described earlier in conjunction with FIG. 14 can be confined to unperceivably short intervals of time, FIG. 21 illustrates how a pulse-width modulated binary signal may be generated during LED illumination intervals to vary LED emitted light brightness. FIG. 22 illustrates an adaptation of the tri-state and Schmitt-trigger/comparator logic akin to that illustrated in the microprocessor I/O pin interface that may be used to sequentially access subsets of LEDs in an LED array as described in conjunction with FIG. 15 and FIG. 16.

FIGS. 23-25 depict exemplary state diagrams for the operation of the LED and the use of input signals and output signals described above. From the viewpoint of the binary mode control signal there are only two states: a detection state and an emission state, as suggested in FIG. 23. From the viewpoint of the role of the LED in a larger system incorporating a multiplexed circuit arrangement such as that of FIG. 17, there may a detection state, an emission state, and an idle state (where there is no emission nor detection occurring), obeying state transition maps such as depicted in FIG. 24 or FIG. 25. At a further level of detail, there are additional considerations:

To emit light, a binary mode control signal can be set to "emit" mode (causing the analog switch to be closed) and the emission light signal must be of sufficient value to cause the LED to emit light (for example, so that the voltage across the LED is above the "turn-on" voltage for that LED).

If the binary mode control signal is in "emit" mode but the emission light signal is not of such sufficient value, the LED will not illuminate. This can be useful for brightness control (via pulse-width modulation), black-screen display, and other uses. In some embodiments, this may be used to coordinate the light emission of neighboring LEDs in an array while a particular LED in the array is in detection mode.

If the emission light signal of such sufficient value but the binary mode control signal is in "detect" mode, the LED will not illuminate responsive to the emission light signal. This allows the emission light signal to be varied during a time interval when there is no light emitted, a property useful for multiplexing arrangements.

During a time interval beginning with the change of state of the binary mode control signal to some settling-time period afterwards, the detection output and/or light emission level may momentarily not be accurate.

To detect light, the binary mode control signal must be in "detect" mode (causing the analog switch to be open). The detected light signal may be used by a subsequent system or ignored. Intervals where the circuit is in detection mode but the detection signal is ignored may be useful for multiplexing arrangement, in providing guard-intervals for settling time, to coordinate with the light emission of neighboring LEDs in an array, etc.

FIG. 26 depicts an exemplary state transition diagram reflecting the above considerations. The top "Emit Mode" box and bottom "Detect Mode" box reflect the states of an LED from the viewpoint of the binary mode control signal as suggested by FIG. 23. The two "Idle" states (one in each of the "Emit Mode" box and "Detect Mode" box) of FIG. 26 reflect (at least in part) the "Idle" state suggested in FIG. 24 and/or FIG. 25. Within the "Emit Mode" box, transitions between "Emit" and "Idle" may be controlled by emit signal multiplexing arrangements, algorithms for coordinating the light emission of an LED in an array while a neighboring LED in the array is in detection mode, etc. Within the "Detect Mode" box, transitions between "Detect" and "Idle" may be controlled by independent or coordinated multiplexing arrangements, algorithms for coordinating the light emission of an LED in an array while a neighboring LED in the array is in detection mode, etc. In making transitions between states in the boxes, the originating and termination states may be chosen in a manner advantageous for details of various multiplexing and feature embodiments. Transitions between the groups of states within the two boxes correspond to the vast impedance shift invoked by the switch opening and closing as driven by the binary mode control signal. In FIG. 26, the settling times between these two groups of states are gathered and regarded as a transitional state.

As mentioned earlier, the amplitude of light emitted by an LED can be modulated to lesser values by means of pulse-width modulation (PWM) of a binary waveform. For example, if the binary waveform oscillates between fully illuminated and non-illuminated values, the LED illumination amplitude will be perceived roughly as 50% of the full-on illumination level when the duty-cycle of the pulse is 50%, roughly as 75% of the full-on illumination level when the duty-cycle of the pulse is 75%, roughly as 10% of the full-on illumination level when the duty-cycle of the pulse is 10%, etc. Clearly the larger fraction of time the LED is illuminated (i.e., the larger the duty-cycle), the brighter the perceived light observed emitted from the LED.

Stacked OLEDs ("SOLED") as Optical Diode Elements for Use in the Invention

Figure 27:
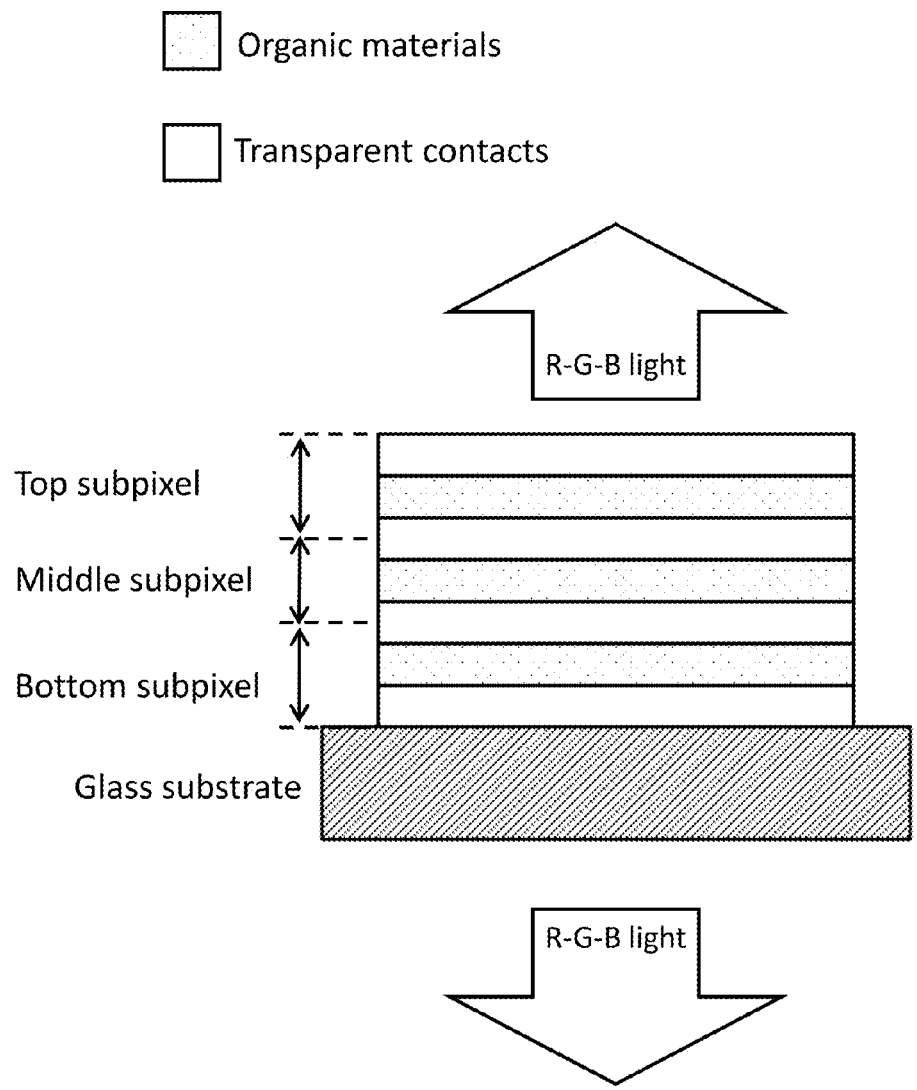
FIG. 27 depicts an exemplary high-level structure of a three-color transparent Stacked OLED ("SOLED") element as can be used for color light emission, color light sensing, or both. (Adapted from G. Gu, G. Parthasarathy, P. Burrows, T. Tian, I. Hill, A. Kahn, S. Forrest, "Transparent stacked organic light emitting devices. I. Design principles and transparent compound electrodes," *Journal of Applied Physics*, October 1999, vol. 86 no. 8, pp. 4067-4075.)

FIG. 27 (adapted from G. Gu, G. Parthasarathy, P. Burrows, T. Tian, I. Hill, A. Kahn, S. Forrest, "Transparent stacked organic light emitting devices. I. Design principles and transparent compound electrodes," Journal of Applied Physics, October 1999, vol. 86 no. 8, pp. 4067-4075) depicts an exemplary high-level structure of a three-color transparent Stacked OLED ("SOLED") element as has been developed for use in light-emitting color displays.

The present invention provides for a three-color transparent SOLED element such as those depicted in FIG. 27 or of other forms developed for use in light-emitting color displays to be used as-is as a color transparent light sensor.

Alternatively, the present invention provides for analogous structures to be used to implement a three-color transparent light sensor, for example, with reference to FIG. 10, by replacing optoelectrical diode materials, structure, and fabrication approaches 1923 optimized for light emission performance 1902 with optoelectrical diode materials, structure, and fabrication approaches 1923 optimized for light detection performance 1901. The present invention additionally provides for a three-color transparent SOLED element such as those depicted in FIG. 27 or of other forms developed for use in light-emitting color displays to employ specific optoelectrical diode materials, structure, and fabrication approaches 1923 to be adjusted to co-optimize an optoelectrical diode for both good light detection performance 1901 and light emission performance 1902 versus cost 1903. The resulting structure can be used for color light emission, color light sensing, or both.

The invention additionally provides for the alternative use of similar or related structures employing OLETs.

Arrayed OLEDs as Optical Diode Elements for Use in the Invention

Figure 28:
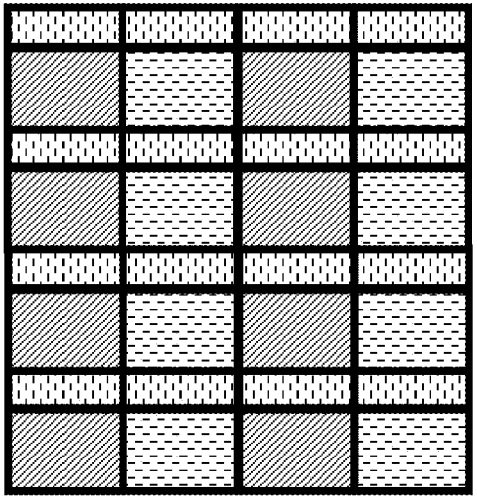
FIG. 28 depicts a conventional "RGB stripe" OLED array as used in a variety of OLED display products and as can be used for light field sensing in accordance with aspects of the present invention. (Adapted from http://www.displayblog.com/2009/03/26/samsung-oled-pentile-matrix-next-iphone-oled-display/(visited Mar. 23, 2011.)
Figure 29:
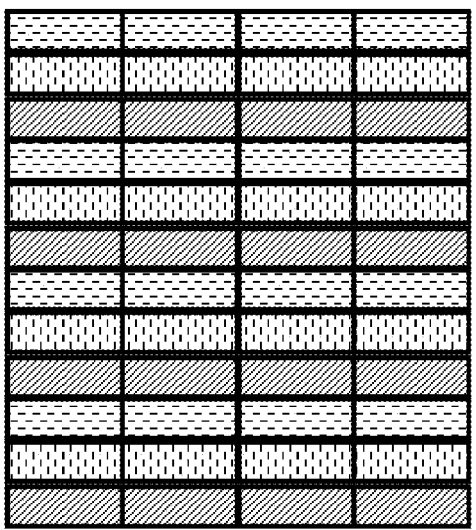
FIG. 29 depicts a representation of the "PenTile Matrix" OLED array as attributed to Samsung and as can be used for light field sensing in accordance with aspects of the present invention. (Adapted from http://www.displayblog.com/2009/03/26/samsung-oled-pentile-matrix-next-iphone-oled-display/(visited Mar. 23, 2011.)

FIG. 28 (adapted from http://www.displayblog.com/2009/03/26/samsung-oled-pentile-matrix-next-iphone-oled-display/(visited Mar. 23, 2011) depicts a conventional "RGB stripe" OLED array as used in a variety of OLED display products. FIG. 29 (also adapted from http://www.displayblog.com/2009/03/26/samsung-oled-pentile-matrix-next-iphone-oled-display/(visited Mar. 23, 2011) depicts a representation of the "PenTile Matrix" OLED array as attributed to Samsung which provides good display performance with a 33% reduction in pixel element count.

The present invention provides for arrays of OLED elements such as those depicted in FIG. 28 and FIG. 29 other forms developed for use in light-emitting color displays to be used as-is as a color light sensors. This permits OLED elements in arrays such as those depicted in FIG. 28 and FIG. 29 or of other forms developed for use in light-emitting color displays to be used for light field sensing in accordance with aspects of the present invention.

Alternatively, the present invention provides for analogous structures to be used to implement a three-color transparent light sensor, for example, with reference to FIG. 10, by replacing optoelectrical diode materials, structure, and fabrication approaches 1923 optimized for light emission performance 1902 with optoelectrical diode materials, structure, and fabrication approaches 1923 optimized for light detection performance 1901. The present invention additionally provides for OLED elements in arrays such as those depicted in FIG. 27 or of other forms developed for use in light-emitting color displays to employ specific optoelectrical diode materials, structure, and fabrication approaches 1923 to be adjusted to co-optimize an optoelectrical diode for both good light detection performance 1901 and light emission performance 1902 versus cost 1903. The resulting structure can be used for color light emission, color light sensing, or both.

The invention additionally provides for the alternative use of similar or related structures employing OLETs.

Light Field Sensor Embodiments

In an embodiment, various materials, physical processes, structures, and fabrication techniques used in creating an array of color inorganic LEDs, OLEDs, OLETs, or related devices and associated co-located electronics (such as FETs, resistors, and capacitors) can be used as-is to create an array of color inorganic LEDs, OLEDs, OLETs, or related devices well-suited as a color light-field sensor. An exemplary general framework underlying such an arrangement is described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

In an embodiment, various materials, physical processes, structures, and fabrication techniques used in creating an array of color inorganic LEDs, OLEDs, OLETs, or related devices and associated co-located electronics (such as FETs, resistors, and capacitors) can be co-optimized to create an array of color inorganic LEDs, OLEDs, OLETs, or related devices well-suited as a color light-field sensor. An exemplary general framework underlying such an arrangement is described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

In an embodiment, at least three inorganic LEDs, OLEDs, or related devices are transparent. In an embodiment, the at least three transparent inorganic LEDs, OLEDs, or related devices are comprised in an array that is overlaid on a display such as an LCD.

Operation as a Combination Light Field Sensor and Display

In embodiment provided for by the invention, each inorganic LED, OLED, or related device in an array of color inorganic LEDs, OLEDs, OLETs, or related devices can be alternately used as a photodetector or as a light emitter. The state transitions of each inorganic LED, OLED, or related device in the array of color inorganic LEDs, OLEDs, OLETs, or related devices among the above states can be coordinated in a wide variety of ways to afford various multiplexing, signal distribution, and signal gathering schemes as can be advantageous. An exemplary general framework underlying such an arrangement is described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

In embodiment provided for by the invention, each inorganic LED, OLED, or related device in an array of inorganic LEDs, OLEDs, or related devices can, at any one time, be in one of three states:

A light emission state,
A light detection state,
An idle state, as can be advantageous for various operating strategies.

The state transitions of each inorganic LED, OLED, or related device in the array of color inorganic LEDs, OLEDs, OLETs, or related devices among the above states can be coordinated in a wide variety of ways to afford various multiplexing, signal distribution, and signal gathering schemes as can be advantageous. An exemplary general framework underlying such an arrangement is described in pending U.S. patent application Ser. No. 12/419,229 (priority date Jan. 27, 1999), pending U.S. patent application Ser.

No. 12/471,275 (priority date May 25, 2008), and in pending U.S. patent application Ser. No. 13/072,588 and U.S. 61/517,454.

Accordingly, in an embodiment various materials, physical processes, structures, and fabrication techniques used in creating an array of color inorganic LEDs, OLEDs, OLETs, or related devices and associated co-located electronics (such as FETs, resistors, and capacitors) can be used as-is, adapted, and/or optimized so that the array of color inorganic LEDs, OLEDs, OLETs, or related devices to work well as both a color image display and color light-field sensor. An exemplary general framework underlying such an arrangement is described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

Physical Structures for Combination Light Field Sensor and Display

The capabilities described thus far can be combined with systems and techniques to be described later in a variety of physical configurations and implementations. A number of example physical configurations and implementations are described here which provide various enablements and advantages to various embodiments and implementations of the invention and their applications. Many variations and alternatives are possible and are accordingly anticipated by the invention, and the example physical configurations and implementations are in no way limiting of the invention.

Figure 30:
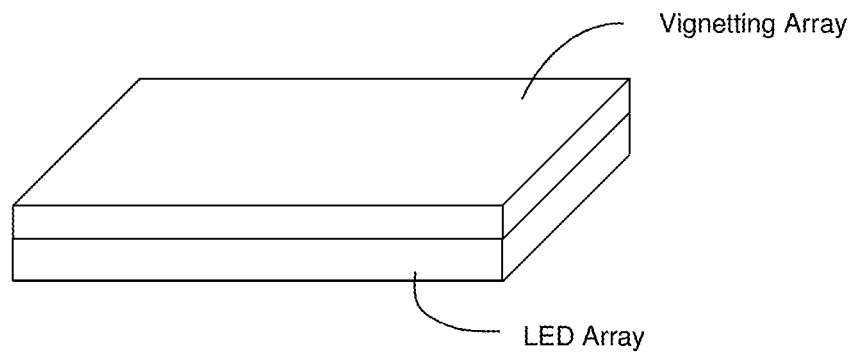
FIG. 30 depicts an exemplary embodiment comprising an LED array preceded by a vignetting arrangement as is useful for implementing a lensless imaging camera as taught in U.S. patent application Ser. No. 12/419,229 (priority date Jan. 27, 1999), Ser. No. 12/471,275 (priority date May 25, 2008), U.S. Ser. No. 13/072,588, and U.S. 61/517,454.

When implementing lensless imaging cameras as taught in U.S. patent application Ser. No. 12/419,229 (priority date Jan. 27, 1999), Ser. No. 12/471,275 (priority date May 25, 2008), U.S. Ser. No. 13/072,588, and U.S. 61/517,454, an optical vignetting arrangement is needed for the light-sensing LEDs. This can be implemented in various ways. In one example approach, LEDs in the LED array themselves can be structured so that light-sensing elements (including photodiodes or LEDs used in light-sensing modes) are partially enveloped in a well comprising walls formed in associating with at least light-emitting LEDs in the LED array. In a variation of this the light emitting LEDs can also be used in a light sensing mode, in implementing a tactile user interface arrangement as enabled by the present invention. In another variation, other types of light sensing elements (for example, photodiodes) can in implementing an optical tactile user interface arrangement as enabled by the present invention. FIG. 30 depicts an exemplary embodiment comprising an LED array preceded by a vignetting arrangement as is useful for implementing a lensless imaging camera as taught in U.S. patent application Ser. No. 12/419,229 (priority date Jan. 27, 1999), Ser. No. 12/471, 275 (priority date May 25, 2008), U.S. Ser. No. 13/072,588, and U.S. 61/517,454. In another approach to be described shortly, an LCD otherwise used for display can be used to create vignetting apertures. The invention provides for inclusion of coordinated multiplexing or other coordinated between the LED array and LCD as needed or advantageous. In another approach, a vignetting arrangement is created as a separate structure and overlaid atop the LED array. Other related arrangements and variations are possible and are anticipated by the invention. The output of the light field sensor can also or alternatively be used to implement a tactile user interface or proximate hand gesture user interface as described later in the detailed description.

Figure 31:
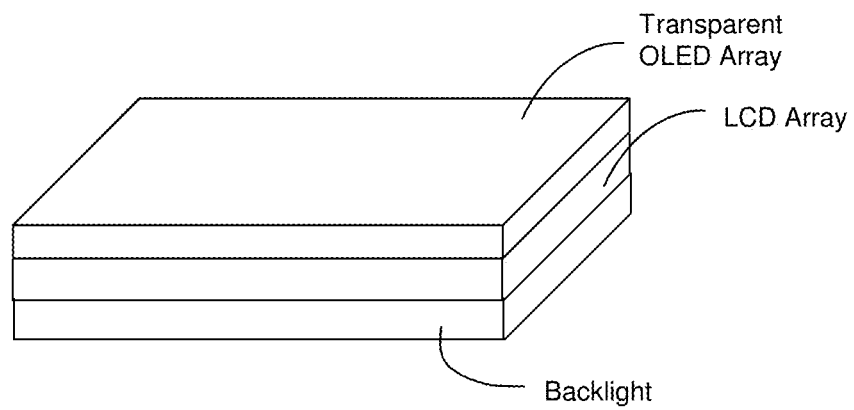
FIG. 31 depicts an exemplary implementation comprising a transparent OLED array overlaid upon an LCD display, which is in turn overlaid on a (typically) LED backlight used to create and direct light though the LCD display from behind.

Leaving the vignetting considerations involved in lensless imaging, attention is now directed to arrangements wherein a transparent LED array, for example implemented with arrays of transparent OLEDs interconnected with transparent conductors, is overlaid atop an LCD display. The transparent conductors can be comprised of materials such as indium tin oxide, fluorine-doped tin oxide ("FTO"), doped zinc oxide, organic polymers, carbon nanotubes, graphene ribbons, etc. FIG. 31 depicts an exemplary implementation comprising a transparent OLED array overlaid upon an LCD visual display, which is in turn overlaid on a (typically) LED backlight used to create and direct light though the LCD visual display from behind. Such an arrangement may be used to implement an optical tactile user interface arrangement as enabled by the present invention. Other related arrangements and variations are possible and are anticipated by the invention. The invention provides for inclusion of coordinated multiplexing or other coordinated between the OLED array and LCD as needed or advantageous. It is noted in one embodiment the LCD and LED array can be fabricated on the same substrate, the first array layered atop the second (or visa versa) while in another embodiment the two LED arrays can be fabricated separately and later assembled together to form layered structure. Other related arrangements and variations are possible and are anticipated by the invention.

Figure 32:
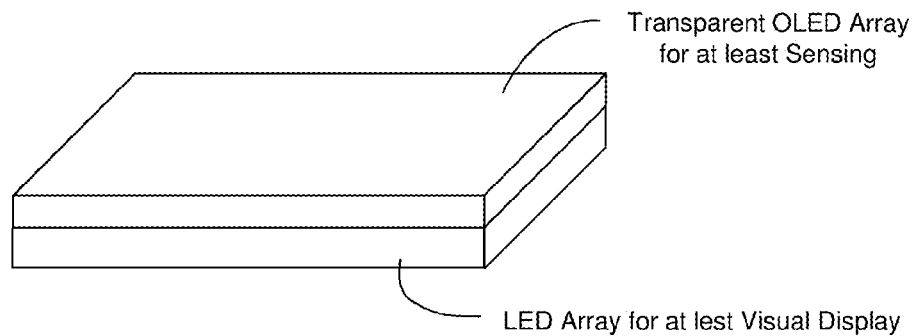
FIG. 32 depicts an exemplary implementation comprising a first transparent OLED array used for at least optical sensing overlaid upon a second OLED array used for at least visual display.

FIG. 32 depicts an exemplary implementation comprising a first (transparent OLED) LED array used for at least optical sensing overlaid upon a second LED array used for at least visual display. In an embodiment, the second LED array can be an OLED array. In an embodiment, either or both of the LED arrays can comprise photodiodes. Such an arrangement can be employed to allow the first array to be optimized for one or more purposes, at least one being sensing, and the second LED array to be optimized for one or more purposes, at least one being visual display. Such an arrangement may be used to implement an optical tactile user interface arrangement as enabled by the present invention. In one approach the second LED array is used for both visual display and tactile user interface illumination light and the first (transparent OLED) LED array is used for tactile user interface light sensing. In another approach, the first (transparent OLED) LED array is used for both tactile user interface illumination light and light sensing, while the second LED array is used for visual display. In an embodiment, the second LED array is used for visual display and further comprises vignetting structures (as described above) and serves as a light field sensor to enable the implementation of a lensless imaging camera. Such an arrangement can be used to implement a light field sensor and a lensless imaging camera as described earlier. Other related arrangements and variations are possible and are anticipated by the invention. The invention provides for inclusion of coordinated multiplexing or other coordinated between the first LED array and second LED array as needed or advantageous. It is noted in one embodiment the two LED arrays can be fabricated on the same substrate, the first array layered atop the second (or visa versa) while in another embodiment the two LED arrays can be fabricated separately and later assembled together to form layered structure. Other related arrangements and variations are possible and are anticipated by the invention.

Figure 33:
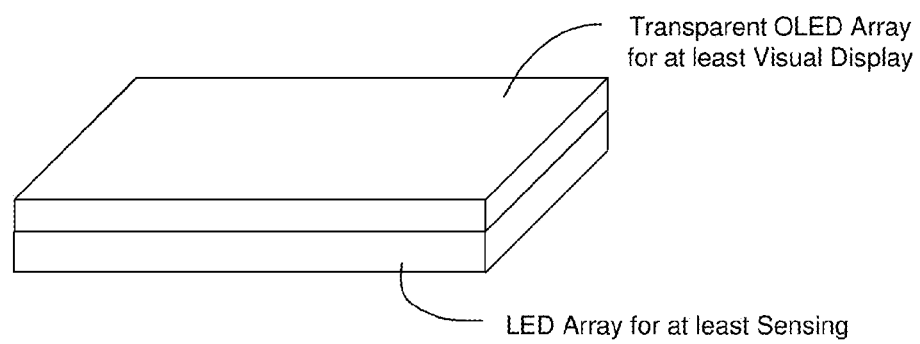
FIG. 33 depicts an exemplary implementation comprising a first transparent OLED array used for at least visual display overlaid upon a second OLED array used for at least optical sensing.

FIG. 33 depicts an exemplary implementation comprising a first (transparent OLED) LED array used for at least visual display overlaid upon a second LED array used for at least optical sensing. In an embodiment, the second LED array can be an OLED array. In an embodiment, either or both of the LED arrays can comprise photodiodes. Such an arrangement can be employed to allow the first array to be optimized for to be optimized for other purposes, at least one being visual display, and the second LED array to be optimized for one or more purposes, at least one being sensing. Such an arrangement may be used to implement an optical tactile user interface arrangement as enabled by the present invention. In one approach the first LED array is used for both visual display and tactile user interface illumination light and the second (transparent OLED) LED array is used for tactile user interface light sensing. In another approach, the second (transparent OLED) LED array is used for both tactile user interface illumination light and light sensing, while the first LED array is used for visual display. In an embodiment, the second LED array comprises vignetting structures (as described above) and serves as a light field sensor to enable the implementation of a lensless imaging camera. Other related arrangements and variations are possible and are anticipated by the invention. The invention provides for inclusion of coordinated multiplexing or other coordinated between the first LED array and second LED array as needed or advantageous. It is noted in one embodiment the two LED arrays can be fabricated on the same substrate, the first array layered atop the second (or visa versa) while in another embodiment the two LED arrays can be fabricated separately and later assembled together to form layered structure. Other related arrangements and variations are possible and are anticipated by the invention.

Figure 34:
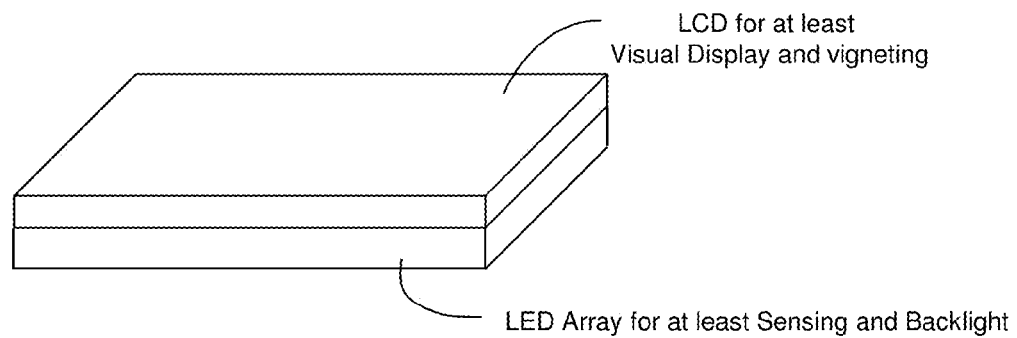
FIG. 34 depicts an exemplary implementation comprising an LCD display, used for at least visual display and vignette formation, overlaid upon a second LED array, used for at least backlighting of the LCD and optical sensing.

FIG. 34 depicts an exemplary implementation comprising an LCD display, used for at least visual display and vignette formation, overlaid upon a second LED array, used for at least backlighting of the LCD and optical sensing. In an embodiment, the LED array can be an OLED array. In an embodiment, the LED array can comprise also photodiodes. Such an arrangement can be used to implement an optical tactile user interface arrangement as enabled by the present invention. Such an arrangement can be used to implement a light field sensor and a lensless imaging camera as described earlier. The invention provides for inclusion of coordinated multiplexing or other coordinated between the LCD and LED array as needed or advantageous. It is noted in one embodiment the LCD and LED array can be fabricated on the same substrate, the first array layered atop the second (or visa versa) while in another embodiment the two LED arrays can be fabricated separately and later assembled together to form layered structure. Other related arrangements and variations are possible and are anticipated by the invention.

Use of a LED Array as "Multi-Touch" Tactile Sensor Array

Figure 35:
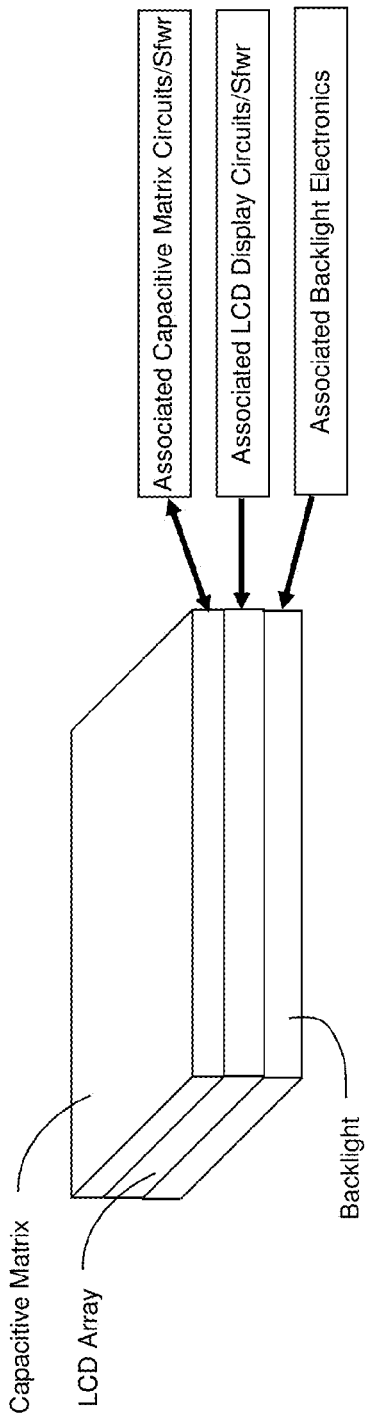
FIG. 35 an exemplary arrangement employed in contemporary cellphones, smartphones, PDAs, tablet computers, and other portable devices wherein a transparent capacitive matrix proximity sensor is overlaid over an LCD display, which is in turn overlaid on a (typically LED) backlight used to create and direct light though the LCD display from behind. Each of the capacitive matrix and the LCD have considerable associated electronic circuitry and software associated with them.

Multitouch sensors on cellphones, smartphones, PDAs, tablet computers, and other such devices typically utilize a capacitive matrix proximity sensor. FIG. 35 an exemplary arrangement employed in contemporary cellphones, smartphones, PDAs, tablet computers, and other portable devices wherein a transparent capacitive matrix proximity sensor is overlaid over an LCD display, which is in turn overlaid on a (typically LED) backlight used to create and direct light though the LCD display from behind. Each of the capacitive matrix and the LCD have considerable associated electronic circuitry and software associated with them.

Figure 36:
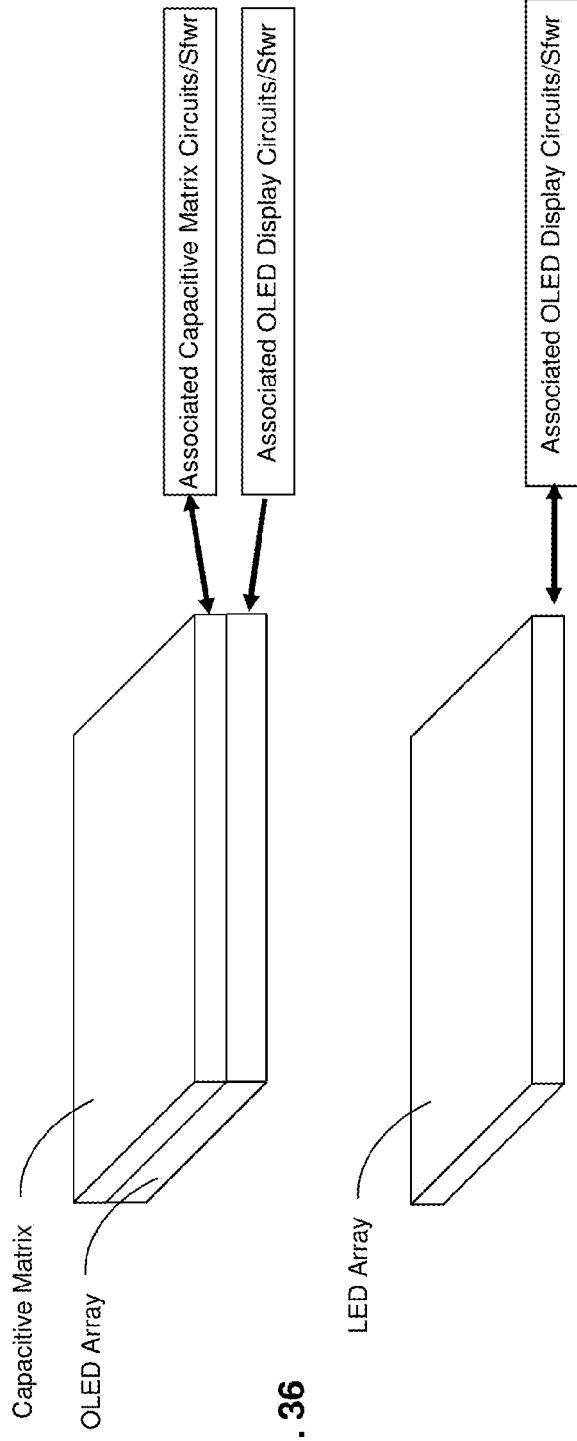
FIG. 36 depicts an exemplary modification of the arrangement depicted in FIG. 35 wherein the LCD display and backlight are replaced with an OLED array used as a visual display. Such an arrangement has started to be incorporated in recent contemporary cellphone, smartphone, PDA, tablet computers, and other portable device products by several manufacturers.

FIG. 36 depicts an exemplary modification of the arrangement depicted in FIG. 35 wherein the LCD display and backlight are replaced with an OLED array used as a visual display. Such an arrangement has started to be incorporated in recent contemporary cellphone, smartphone, PDA, tablet computers, and other portable device products by several manufacturers. Note the considerable reduction in optoelectronic, electronic, and processor components over the arrangement depicted in FIG. 35. This is one of the motivations for using OLED displays in these emerging product implementations.

Figure 37:
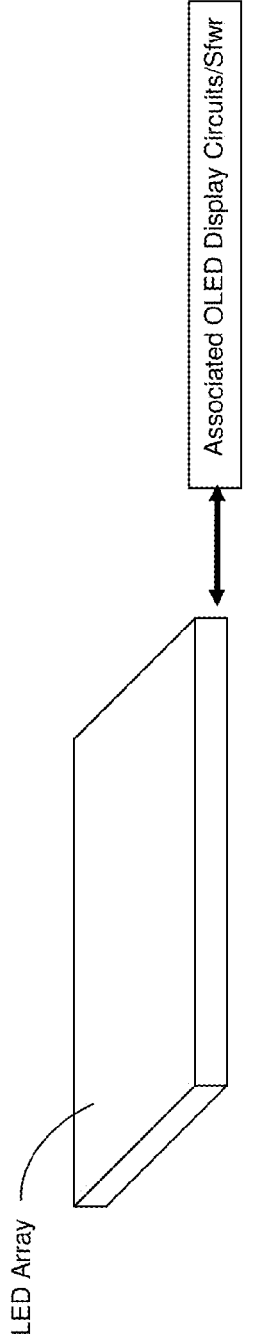
FIG. 37 depicts an exemplary arrangement provided for by the invention comprising only a LED array. The LEDs in the LED array may be OLEDs or inorganic LEDs. Such an arrangement can be used as a visual display and as a tactile user interface.

FIG. 37 depicts an exemplary arrangement provided for by the invention comprising only a LED array. The LEDs in the LED array may be OLEDs or inorganic LEDs. Such an arrangement can be used as a tactile user interface, or as a combined a visual display and tactile user interface, as will be described next. Note the considerable reduction in optoelectronic, electronic, and processor components over the both the arrangement depicted in FIG. 35 and the arrangement depicted in FIG. 36. This is one of the advantages of many embodiments of the present invention.

Figure 38:
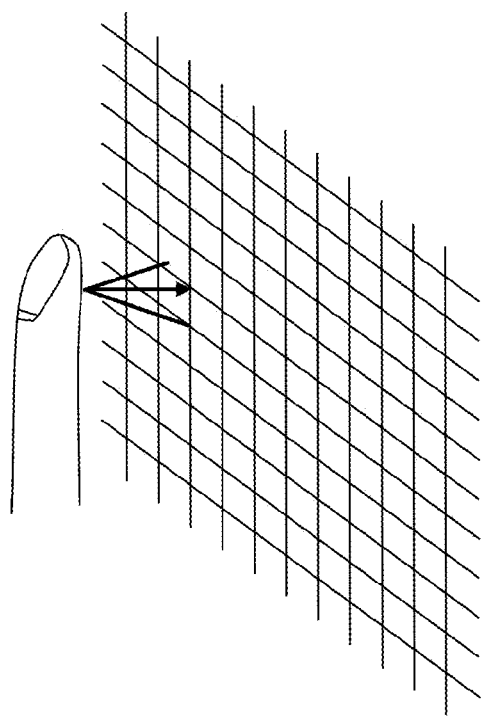
FIG. 38 depicts a representative exemplary arrangement wherein light emitted by neighboring LEDs is reflected from a finger back to an LED acting as a light sensor.

Arrays of inorganic-LEDs have been used to create a tactile proximity sensor array as taught by Han in U.S. Pat. No. 7,598,949 and as depicted in the video available at http://cs.nyu.edu/.about.jhan/ledtouch/index.html). FIG. 38 depicts a representative exemplary arrangement wherein light emitted by neighboring LEDs is reflected from a finger (or other object) back to an LED acting as a light sensor.

In its most primitive form, such LED-array tactile proximity array implementations need to be operated in a darkened environment (as seen in the video available at http://cs.nyu.edu/.about.jhan/ledtouch/index.html). The invention provides for additional systems and methods for not requiring darkness in the user environment in order to operate the LED array as a tactile proximity sensor.

In one approach, potential interference from ambient light in the surrounding user environment can be limited by using an opaque pliable and/or elastically deformable surface covering the LED array that is appropriately reflective (directionally, amorphously, etc. as may be advantageous in a particular design) on the side facing the LED array. Such a system and method can be readily implemented in a wide variety of ways as is clear to one skilled in the art.

In another approach, potential interference from ambient light in the surrounding user environment can be limited by employing amplitude, phase, or pulse width modulated circuitry and/or software to control the light emission and receiving process. For example, in an implementation the LED array can be configured to emit modulated light that is modulated at a particular carrier frequency and/or with a particular time-variational waveform and respond to only modulated light signal components extracted from the received light signals comprising that same carrier frequency or time-variational waveform. Such a system and method can be readily implemented in a wide variety of ways as is clear to one skilled in the art.

The light measurements used for implementing a tactile user interface can be from unvignetted LEDs, unvignetted photodiodes, vignetted LEDs, vignetted photodiodes, or combinations of two or more of these.

Separate Sensing and Display Elements in an LED Array

Figure 39:
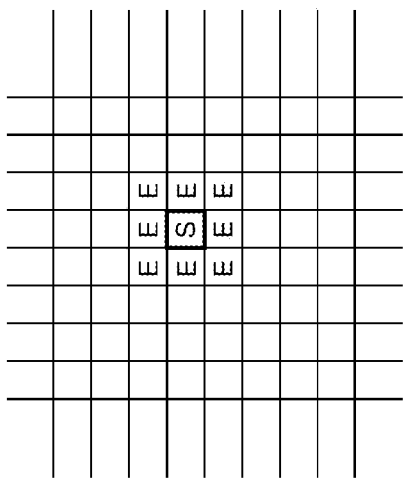
FIG. 39 depicts an exemplary arrangement wherein a particular LED designated to act as a light sensor is surrounded by immediately-neighboring LEDs designated to emit light to illuminate the finger for example as depicted in FIG. 38.

In one embodiment provided for by the invention, some LEDs in an array of LEDs are used as photodetectors while other elements in the array are used as light emitters. The light emitter LEDs can be used for display purposes and also for illuminating a finger (or other object) sufficiently near the display. FIG. 39 depicts an exemplary arrangement wherein a particular LED designated to act as a light sensor is surrounded by immediately-neighboring element designated to emit light to illuminate the finger for example as depicted in FIG. 38. Other arrangements of illuminating and sensing LEDs are of course possible and are anticipated by the invention.

It is also noted that by dedicating functions to specific LEDs as light emitters and other elements as light sensors, it is possible to optimize the function of each element for its particular role. For example, in an example embodiment the elements used as light sensors can be optimized photodiodes. In another example embodiment, the elements used as light sensors can be the same type of LED used as light emitters. In yet another example embodiment, the elements used as light sensors can be LEDs that are slightly modified versions the of type of LED used as light emitters.

In an example embodiment, the arrangement described above can be implemented only as a user interface. In an example implementation, the LED array can be implemented as a transparent OLED array that can be overlaid atop another display element such as an LCD or another LED array. In an implementation, LEDs providing user interface illumination provide light that is modulated at a particular carrier frequency and/or with a particular time-variational waveform as described earlier.

In an alternative example embodiment, the arrangement described above can serve as both a display and a tactile user interface. In an example implementation, the light emitting LEDs in the array are time-division multiplexed between visual display functions and user interface illumination functions. In another example implementation, some light emitting LEDs in the array are used for visual display functions while light emitting LEDs in the array are used for user interface illumination functions. In an implementation, LEDs providing user interface illumination provide modulated illumination light that is modulated at a particular carrier frequency and/or with a particular time-variational waveform. In yet another implementation approach, the modulated illumination light is combined with the visual display light by combining a modulated illumination light signal with a visual display light signal presented to each of a plurality of LEDs within the in the LED array. Such a plurality of LEDs can comprise a subset of the LED array or can comprise the entire LED array.

Figure 40:
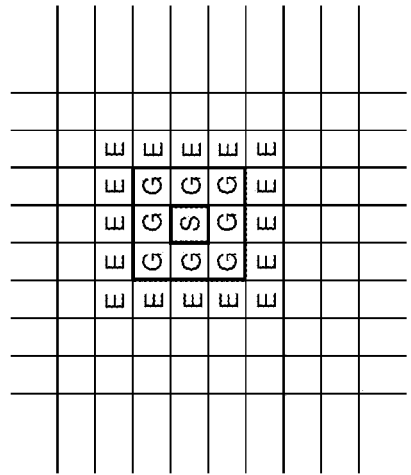
FIG. 40 depicts an exemplary arrangement wherein a particular LED designated to act as a light sensor is surrounded by immediately-neighboring LEDs designated to serve as a "guard" area, for example not emitting light, these in turn surrounded by immediately-neighboring LEDs designated to emit light used to illuminate the finger for example as depicted in FIG. 38.

FIG. 40 depicts an exemplary arrangement wherein a particular LED designated to act as a light sensor is surrounded by immediately-neighboring LEDs designated to serve as a "guard area," for example not emitting light, these in turn surrounded by immediately-neighboring LEDs designated to emit light used to illuminate the finger for example as depicted in FIG. 38. Such an arrangement can be implemented in various physical and multiplexed ways as advantageous to various applications or usage environments.

In an embodiment, the illumination light used for tactile user interface purposes can comprise an invisible wavelength, for example infrared or ultraviolet.

Sequenced Sensing and Display Modes for LEDs in an LED Array

In another embodiment provided for by the invention, each LED in an array of LEDs can be used as a photodetector as well as a light emitter wherein each individual LED can either transmit or receive information at a given instant. In an embodiment, each LED in a plurality of LEDs in the LED array can sequentially be selected to be in a receiving mode while others adjacent or near to it are placed in a light emitting mode. Such a plurality of LEDs can comprise a subset of the LED array or can comprise the entire LED array. A particular LED in receiving mode can pick up reflected light from the finger, provided by said neighboring illuminating-mode LEDs. In such an approach, local illumination and sensing arrangements such as that depicted FIG. 39 (or variations anticipated by the invention) can be selectively implemented in a scanning and multiplexing arrangement.

FIG. 40 depicts an exemplary arrangement wherein a particular LED designated to act as a light sensor is surrounded by immediately-neighboring LEDs designated to serve as a "guard" area, for example not emitting light, these in turn surrounded by immediately-neighboring LEDs designated to emit light used to illuminate the finger for example as depicted in FIG. 38. Such an arrangement can be implemented in various multiplexed ways as advantageous to various applications or usage environments.

In an alternative example embodiment, the arrangement described above can serve as both a display and a tactile user interface. In an example implementation, the light emitting LEDs in the array are time-division multiplexed between visual display functions and user interface illumination functions. In another example implementation, some light emitting LEDs in the array are used for visual display functions while light emitting LEDs in the array are used for user interface illumination functions. In an implementation, LEDs providing user interface illumination provide modulated illumination light that is modulated at a particular carrier frequency and/or with a particular time-variational waveform. In yet another implementation approach, the modulated illumination light is combined with the visual display light by combining a modulated illumination light signal with a visual display light signal presented to each of a plurality of LEDs within the in the LED array. Such a plurality of LEDs can comprise a subset of the LED array or can comprise the entire LED array.

Use of a LED Array in Implementing a Lensless Imaging Camera

In an embodiment, various materials, physical processes, structures, and fabrication techniques used in creating an array of color inorganic LEDs, OLEDs, OLETs, or related devices and associated co-located electronics (such as FETs, resistors, and capacitors) can be used as-is, adapted, and/or optimized so as to create an array of color inorganic LEDs, OLEDs, OLETs, or related devices that is well-suited as for operation as a color lensless imaging camera according to the general framework described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

Co-pending patent applications U.S. Ser. No. 12/471,275 (priority date Jan. 27, 1999), U.S. Ser. No. 12/419,229, U.S. Ser. No. 13/072,588, and U.S. 61/517,454 teach, among other things, the use of an LED array, outfitted with micro-optical arrangements that create optical occulting/vignetting and interfaced with a new type of "image formation" signal processing, as a (monochrome or color) camera for image or video applications.

Image formation is performed without a conventional large shared lens and associated separation distance between lens and image sensor, resulting in a "lensless camera."

Further, the similarities between the spectral detection band and the spectral emission bands of each of a plurality of types of colored-light LED may be used to create a color light-field sensor from a color LED array display such as that currently employed in "LED TV" products, large outdoor color-image LED displays (as seen in advertising signs and sports stadiums), and recently (in the form of OLED displays) in Samsung Smartphones.

In an embodiment, the various materials, physical processes, structures, and fabrication techniques used in creating the LED array and associated co-located electronics (such as FETs, resistors, and capacitors) may be used to further co-optimize a high performance monochrome LED array or color LED array to work well as both an image display and light-field sensor compatible with synthetic optics image formation algorithms using methods, systems, and process such as those aforedescribed.

Operation as a Combination Color Lensless Imaging Camera and Color Visual Display The examples above employ an LED array multiplexed in between light-emitting modes and light-sensing modes. The examples above employ an LED array to be used in visual (image, video, GUI) display modes and lensless imaging camera modes. The invention provides for these to be integrated together into a common system, leveraging one or more of a shared electronics infrastructure, shared processor infrastructure, and shared algorithmic infrastructure.

In an embodiment, an array of color inorganic LEDs, OLEDs, OLETs, or related devices, together with associated signal processing aspects of the invention, can be adapted to function as both a color image display and color light-field sensor compatible with synthetic optics image formation algorithms using methods, systems, and process such as those described in pending U.S. patent application Ser. No. 12/419,229 (priority date Jan. 27, 1999), pending U.S. patent application Ser. No. 12/471,275 (priority date May 25, 2008), and in pending U.S. patent application Ser. No. 13/072,588 and U.S. 61/517,454.

Either of these arrangements allows for a common processor to be used for display and camera functionalities. The result dramatically decreases the component count and system complexity for contemporary and future mobile devices such as cellphones, smartphones, PDAs tablet computers, and other such devices.

Use of a LED Array as an Integrated Camera and a Display Simultaneously

The invention further provides for a common LED array multiplexed in between light-emitting display modes and light-sensing lensless imaging camera modes. Here the LED array to be time multiplexed between "image capture" and "image display" modes so as to operate as an integrated camera/display. The invention provides for these to be integrated together into a common system, leveraging one or more of a shared electronics infrastructure, shared processor infrastructure, and shared algorithmic infrastructure.

The integrated camera/display operation removes the need for a screen-direction camera and interface electronics in mobile devices. The integrated camera/display operation can also improve eye contact in mobile devices.

Employing these constructions, the invention provides for an LED array image display, used in place of a LCD image display, to serve as a time-multiplexed array of light emitter and light detector elements. The resulting system does not require an interleaving or stacking of functionally-differentiated (with respect to light detection and light emission) elements. This is particularly advantageous as there is a vast simplification in manufacturing and in fact close or precise alignment with current LED array image display manufacturing techniques and existing LED array image display products.

Either of these arrangements allows for a common processor to be used for display and camera functionalities. The result dramatically decreases the component count and system complexity for contemporary and future mobile devices such as cellphones, smartphones, PDAs, tablet computers, and other such devices.

Use of a LED Array in Implementing a (Tactile User Interface) Touch Screen Sensor In an embodiment, an array of color inorganic LEDs, OLEDs, OLETs, or related devices, together with associated signal processing aspects of the invention, can be used to implement a tactile (touch-based) user interface sensor.

Use of a LED Array in Implementing a Combination (Tactile User Interface) Touch Screen Sensor and Color Visual Image Display In an embodiment, an array of color inorganic LEDs, OLEDs, OLETs, or related devices, together with associated signal processing aspects of the invention, can be adapted to function as both a color image visual display and light-field sensor which can be used to implement a tactile user interface.

The integrated tactile user interface sensor capability can remove the need for a tactile user interface sensor (such as a capacitive matrix proximity sensor) and associated components.

Either of these arrangements allows for a common processor to be used for display and camera functionalities. The result dramatically decreases the component count and system complexity for contemporary and future mobile devices such as cellphones, smartphones, PDAs, tablet computers, and other such devices.

Use of a LED Array as an Integrated Camera, Display, and (Tactile User Interface) Touch Screen In an approach to the invention, the LED array is multiplexed among display, camera, and tactile user interface sensor modalities. In an exemplary associated embodiment of the invention, an LED array can be used as a display, camera, and touch-based user interface sensor.

The integrated camera/display operation removes the need for a screen-direction camera and interface electronics in mobile devices. The integrated camera/display operation can also improve eye contact in mobile devices.

The integrated tactile user interface sensor capability can remove the need for a tactile user interface sensor (such as a capacitive matrix proximity sensor) and associated components.

Either of these arrangements allows for a common processor to be used for display, camera, and tactile user interface sensor functionalities. The result dramatically decreases the component count and system complexity for contemporary and future mobile devices such as smartphones PDAs, tablet computers, and other such devices.

Use of a LED Array in Implementing a Proximate Gesture User Interface Sensor

In an embodiment, an array of color inorganic LEDs, OLEDs, OLETs, or related devices, together with associated signal processing aspects of the invention, can be adapted to function as both an image display and light-field sensor which can be used to implement a proximate (hand image) gesture user interface sensor as, for example, replacing the photodiode sensor arrangement used in the M.I.T. BI-DI user interface. In one approach, the M.I.T. BI-DI photodiode sensor arrangement behind the LCD array can be replaced with an array of inorganic LEDs, OLEDs, or related devices as provided for in the current invention. In another approach, the M.I.T. BI-DI photodiode sensor arrangement behind the LCD array, the LCD itself, and the associated backlight can be replaced with an array of inorganic LEDs, OLEDs, or related devices as provided for in the current invention.

The integrated proximate (hand image) gesture user interface capability can remove the need for a tactile user interface sensor (such as a capacitive matrix proximity sensor) and associated components.

Either of these arrangements allows for a common processor to be used for display, camera, and tactile user interface sensor functionalities. The result dramatically decreases the component count and system complexity for contemporary and future mobile devices such as cellphones, smartphones, PDAs, tablet computers, and other such devices.

Use in Implementing a Combination Proximate Gesture User Interface and Visual Image Display In an embodiment, an array of color inorganic LEDs, OLEDs, OLETs, or related devices, together with associated signal processing aspects of the invention, can be adapted to function as both a visual image display and light-field sensor which can be used to implement a proximate gesture user interface sensor as, for example, replacing the photodiode sensor and LCD display arrangement used in the M.I.T. BI-DI user interface. In an embodiment an array of inorganic LEDs, OLEDs, or related devices can be adapted to function as both an image display and light-field sensor which can be used to implement a tactile user interface sensor, and also as a visual display.

The integrated proximate (hand image) gesture user interface capability can remove the need for a tactile user interface sensor (such as a capacitive matrix proximity sensor) and associated components.

Either of these arrangements allows for a common processor to be used for display, camera, and tactile user interface sensor functionalities. The result dramatically decreases the component count and system complexity for contemporary and future mobile devices such as cellphones, smartphones, PDAs, tablet computers, and other such devices.

Use in Implementing a Combination Proximate Gesture User Interface Sensor, Lensless Imaging Camera, and Visual Image Display In an embodiment, an array of color inorganic LEDs, OLEDs, OLETs, or related devices, together with associated signal processing aspects of the invention, can be adapted to function as both an image display and light-field sensor which can be used to implement a proximate gesture user interface sensor, lensless imaging camera, and visual image display.

The integrated camera/display operation removes the need for a screen-direction camera and interface electronics in mobile devices. The integrated camera/display operation can also improve eye contact in mobile devices.

The integrated proximate (hand image) gesture user interface capability can remove the need for a tactile user interface sensor (such as a capacitive matrix proximity sensor) and associated components.

Either of these arrangements allows for a common processor to be used for display, camera, and tactile user interface sensor functionalities. The result dramatically decreases the component count and system complexity for contemporary and future mobile devices such as cellphones, smartphones, PDAs, tablet computers, and other such devices.

Use in Implementing a Combination Proximate Gesture User Interface, Tactile User Interface (Touchscreen), and Visual Image Display In an embodiment, an array of color inorganic LEDs, OLEDs, OLETs, or related devices, together with associated signal processing aspects of the invention, can be adapted to function as both an image display and light-field sensor which can be used to implement a proximate gesture user interface, tactile user interface (touchscreen), and visual image display.

Further, the integrated combination of a tactile user interface (touch screen) capability and a proximate (hand image) gesture user interface capability can provide a more flexible, sophisticated, and higher accuracy user interface.

Further, as the integrated tactile user interface (touch screen) and a proximate (hand image) gesture user interface capabilities employ the light filed sensor modalities for the LED array, this approach can remove the need for a tactile user interface sensor (such as a capacitive matrix proximity sensor) and associated components.

Either of these arrangements allows for a common processor to be used for display, camera, proximate gesture user interface, and tactile user interface (touch screen) functionalities. The result dramatically decreases the component count and system complexity for contemporary and future mobile devices such as cellphones, smartphones, PDAs, tablet computers, and other such devices.

Use in Implementing a Combination Proximate Gesture User Interface, Tactile User Interface (Touchscreen), Lensless Imaging Camera, and Visual Image Display In an embodiment, an array of color inorganic LEDs, OLEDs, OLETs, or related devices, together with associated signal processing aspects of the invention, can be adapted to function as both an image display and light-field sensor which can be used to implement a proximate gesture user interface, tactile user interface (touchscreen), lensless imaging camera, and visual image display.

The integrated camera/display operation removes the need for a screen-direction camera and interface electronics in mobile devices. The integrated camera/display operation can also improve eye contact in mobile devices.

Further, the integrated combination of a tactile user interface (touch screen) capability and a proximate (hand image) gesture user interface capability can provide a more flexible, sophisticated, and higher accuracy user interface.

Either of these arrangements allows for a common processor to be used for display, camera, proximate gesture user interface, and tactile user interface (touch screen) functionalities. The result dramatically decreases the component count and system complexity for contemporary and future mobile devices such as cellphones, smartphones, PDAs, tablet computers, and other such devices.

System Architecture Advantages and Consolidation Opportunities for Mobile Devices The arrangements described above allow for a common processor to be used for display and camera functionalities. The result dramatically decreases the component count, system hardware complexity, and inter-chip communications complexity for contemporary and future mobile devices such as cellphones, smartphones, PDAs, tablet computers, and other such devices.

Figure 41:
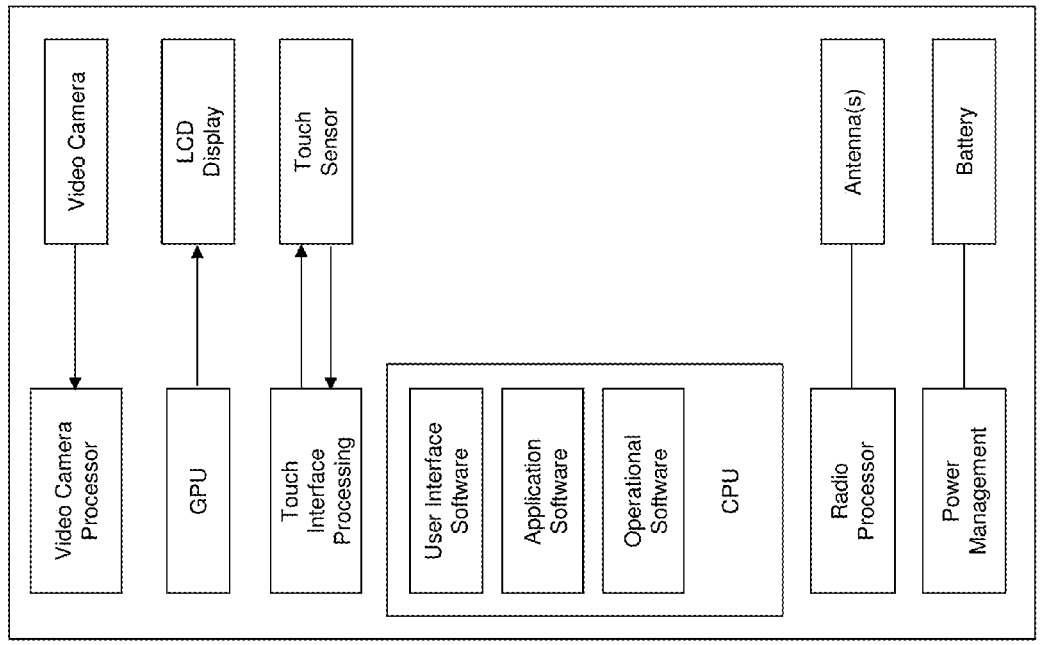
FIG. 41 depicts an exemplary reference arrangement comprised by mobile devices such as cellphones, smartphones, PDAs, tablet computers, and other such devices.

FIG. 41 depicts an exemplary reference arrangement comprised by mobile devices such as cellphones, smartphones, PDAs, tablet computers, and other such devices.

Figure 42:
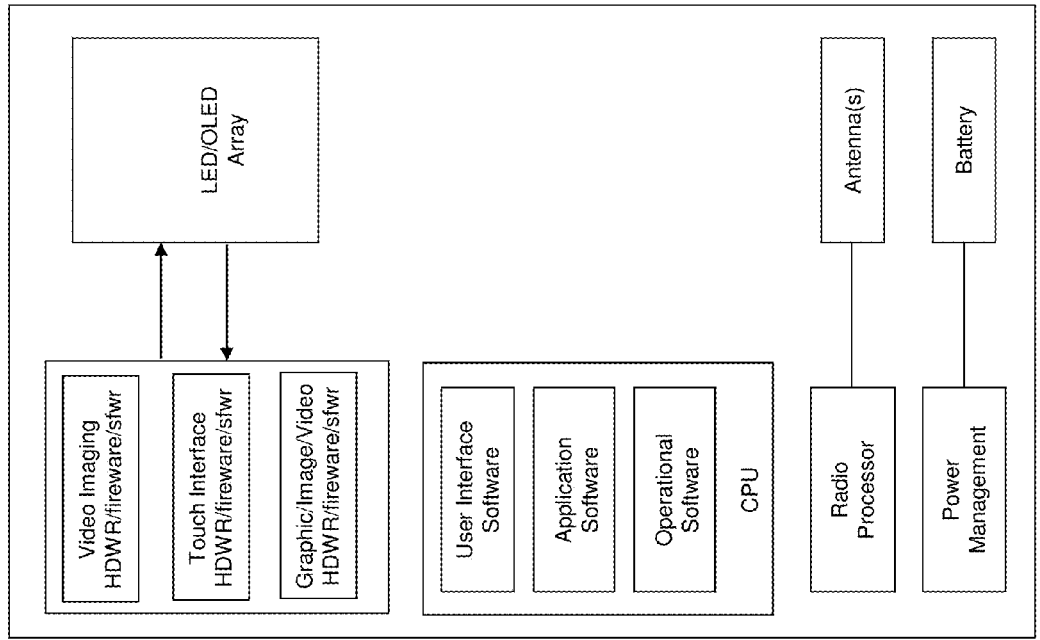
FIG. 42 depicts an exemplary variation of the exemplary reference arrangement of FIG. 41 wherein an LED array replaces the display, camera, and touch sensor and is interfaced by a common processor that replaces associated support hardware.

FIG. 42 depicts an exemplary variation of the exemplary reference arrangement of FIG. 41 wherein an LED array replaces the display, camera, and touch sensor and is interfaced by a common processor that replaces associated support hardware. In an embodiment, the common processor is a Graphics Processing Unit ("GPU") or comprises a GPU architecture.

Figure 43:
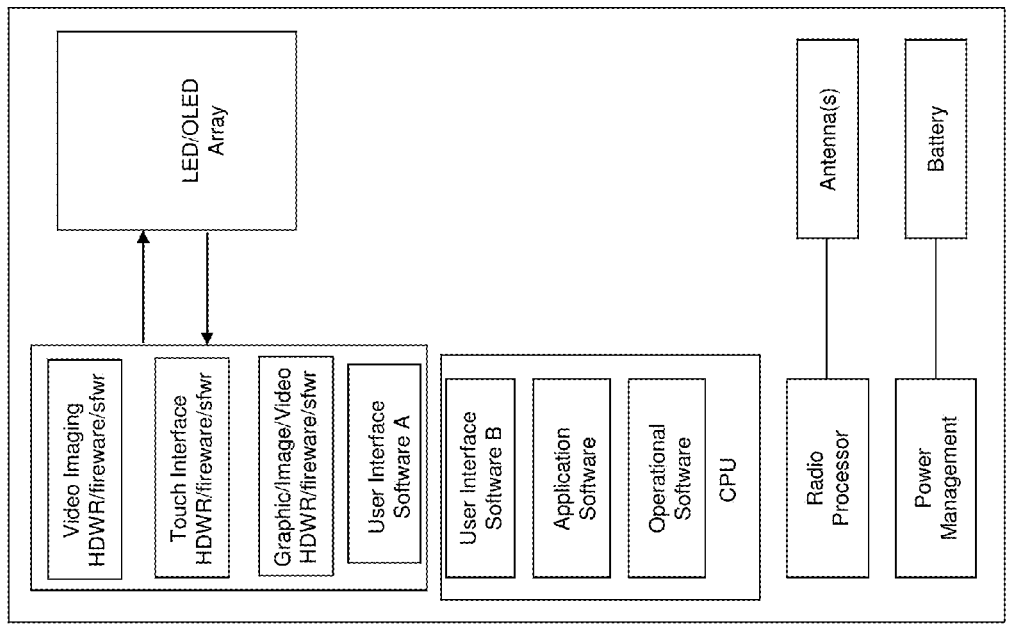
FIG. 43 depicts an exemplary variation of the exemplary reference arrangement of FIG. 42 wherein the common processor associated with the LED array further executes at least some touch-based user interface software.

FIG. 43 depicts an exemplary variation of the exemplary reference arrangement of FIG. 42 wherein the common processor associated with the LED array further executes at least some touch-based user interface software.

Figure 44:
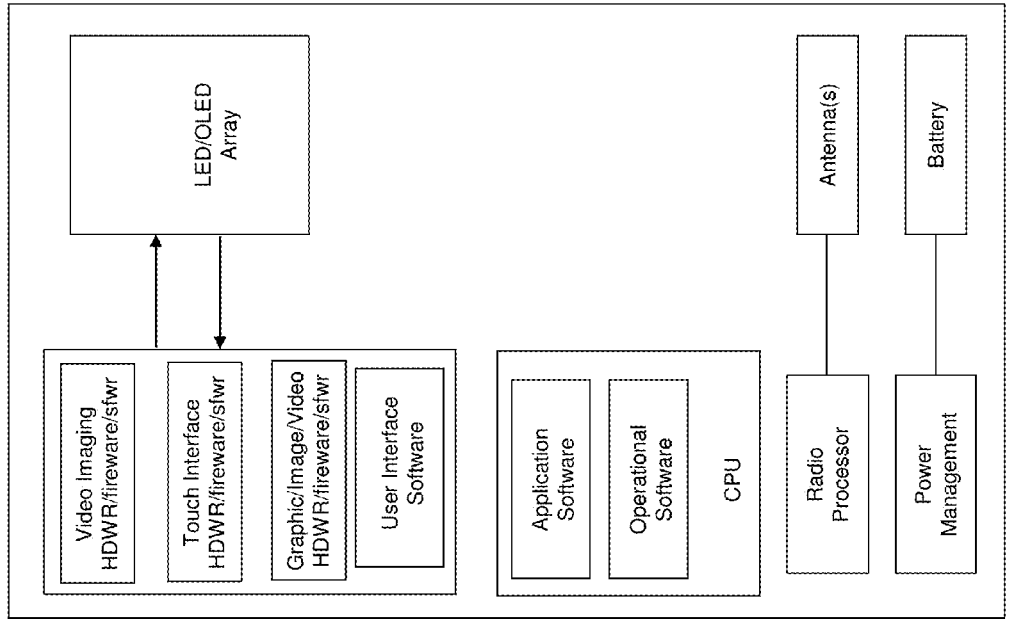
FIG. 44 depicts an exemplary variation of the exemplary reference arrangement of FIG. 42 wherein the common processor associated with the LED array further executes all touch-based user interface software.

FIG. 44 depicts an exemplary variation of the exemplary reference arrangement of FIG. 42 wherein the common processor associated with the LED array further executes all touch-based user interface software.

Advantageous Use of Supplemental Integrated Capacitive Sensors

Figure 46:
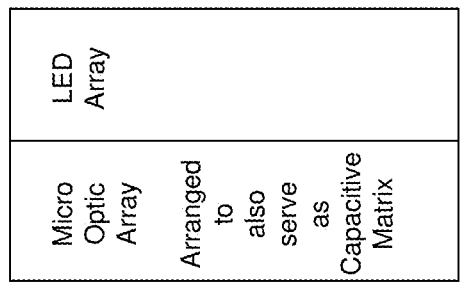
FIG. 46 depicts an exemplary embodiment comprising an LED array preceded by a micro optics array configured to also function as a capacitive matrix sensor.
Figure 45:
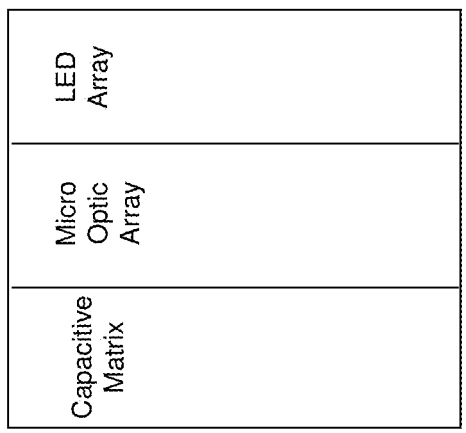
FIG. 45 depicts an exemplary embodiment comprising an LED array preceded by a micro optics array and a capacitive matrix sensor
Figure 47:
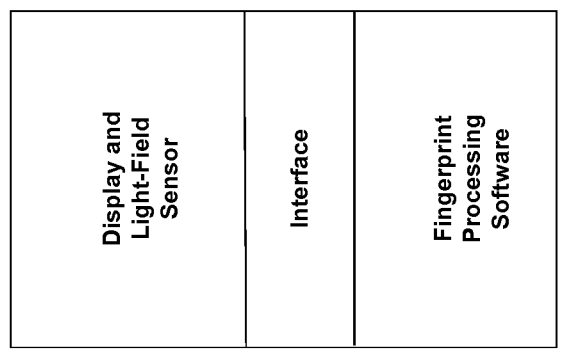
FIG. 47 depicts an exemplary embodiment comprising an image visual display and light-field sensor which can be used to implement a tactile user interface with fingerprint processing capabilities.

In an embodiment, a capacitive sensor may be used to supplement the optical tactile sensing capabilities describe thus far. FIG. 45 depicts an exemplary embodiment comprising an LED array preceded by a microoptics vignetting array and a capacitive matrix sensor. FIG. 46 depicts an exemplary embodiment comprising an LED array preceded by a microoptics vignetting array that is physically and electrically configured to also function as a capacitive matrix sensor. This can be accomplished by making at least some portions of the microoptics vignetting array electrically conductive.

Fingerprint Sensing, Scanning, and Processing Capabilities

In an embodiment, an array of color inorganic LEDs, OLEDs, OLETs, or related devices, together with associated signal processing aspects of the invention, can be adapted to function as a color image visual display and light-field sensor which can be used to implement a tactile user interface with fingerprint processing capabilities.

Fingerprint processing software can provide the processing capabilities associated with fingerprint images and data such as recognition, analysis, storage, scanning, etc. It is commonly accepted that fingerprint recognition requires a fingerprint sensor to have a minimum of 250-300 dpi (dots per inch) resolution in order to measure fingerprint minutiae. In an example embodiment, the sensing capability of a LED or OLED array can be implemented with a minimum resolution of 250-300 dpi and presented to Fingerprint processing software. In another example embodiment, the sensing capability of a LED or OLED array can be implemented with a minimum resolution of 500 dpi, a resolution commonly found in many contemporary fingerprint sensor systems responsive to minutiae. In yet other embodiments of the present application, the resolution of the sensing capability of a LED or OLED array can be as high as 1,000 dpi. The various choices of resolution will typically depend on the intended function and needed level of accuracy and/or performance. Various levels of security and encryption can also be implemented to prevent breaches of privacy or security associated with fingerprint recognition and processing.

In another embodiment, the sensing capability of a LED or OLED array can implement multiple parallel fingerprint processing capabilities for processing a plurality of fingers, or a plurality of hands.

The invention provides for a common LED or OLED array to be used for two or more of display, fingerprint processing, and other functionalities including touch screen sensing, touch gesture user interfaces, hand-image gesture sensing, document scanning (to be described), and secure optical data exchange (to be described). Such resulting integrated-function configurations can dramatically decrease the component count and system complexity for contemporary and future mobile devices such as cellphones, smartphones, PDAs, tablet computers, and other such devices.

In some embodiments, a common processor to be used for two or more of display, fingerprint processing, and other functionalities including touch screen sensing, touch gesture user interfaces, hand-image gesture sensing, document scanning (to be described), and secure optical data exchange (to be described). Such resulting integrated-function configurations can dramatically decrease the component count and system complexity for contemporary and future mobile devices such as cellphones, smartphones, PDAs, tablet computers, and other such devices.

Document Scanning Capabilities

In another embodiment, the sensing capability of a LED or OLED array can be used to implement document scanning capabilities. For example, the LED or OLED array can be placed atop a document or other surface comprising an image, text, texture, and/or other material to be scanned. At a given instant, individual LEDs or OLEDS can be used to selectively illuminate the document or other surface while other neighboring (or near-neighbor) LEDs or OLEDS can be used to selectively sense light reflected image, text, texture, and/or other material to be scanned.

The invention provides for a common LED or OLED array to be used for two or more of display, document scanning, and other functionalities including touch screen sensing, touch gesture user interfaces, hand-image gesture sensing, fingerprint sensing, and secure optical data exchange (to be described). Such resulting integrated-function configurations can dramatically decrease the component count and system complexity for contemporary and future mobile devices such as cellphones, smartphones, PDAs, tablet computers, and other such devices.

In some embodiments, a common processor to be used for two or more of display, document scanning, and other functionalities including touch screen sensing and/or processing, touch gesture user interfaces, hand-image gesture sensing, restore recognition, fingerprint scanning and/or processing, and secure optical data exchange (to be described). Such resulting integrated-function configurations can dramatically decrease the component count and system complexity for contemporary and future mobile devices such as cellphones, smartphones, PDAs, tablet computers, and other such devices.

Secure Optical Data Exchange Capabilities

In another embodiment, the sensing capability of an LED or OLED array can be used to implement secure optical data exchange capabilities between pairs of user devices. For example, the LED or OLED array of a first device can be positioned to be in effectively direct contact (or near so), face-to-face with an LED or OLED array of another device. Once in this configuration, one or more of the following optical data communications events of transactions can occur between the first device and second device:

Individual LEDs or OLEDS in an LED or OLED array the first device can be used to selectively emit time-varying light patterns that are sensed by the individual LEDs or OLEDS on the second device.

Individual LEDs or OLEDS in an LED or OLED array the second device can be used to selectively emit time-varying light patterns that are sensed by the individual LEDs or OLEDS on the first device.

These data transactions can occur in half-duplex mode, full-duplex mode, or according to other data transfer strategies or arrangements. Redundancy checks, flow control, and other data protocols can be employed, including one or more of full IP (Internet Protocol), TCP (Transmission Control Protocol), UDP (User Datagram Protocol), FTP (File Transfer Protocol) protocol stacks. Because the LED or OLED array of a first device is positioned to be in effectively direct contact (or near so), face-to-face with an LED or OLED array of the second device, most if not all the light is exchanged between the devices with little if any light leakage. By transmitting data with suitably-structured time-varying spatially-distributed light patterns, any light leakage would contain inadequate portions of the optical transmission transactions. Additional security could be obtained by spatially confining data-carrying patterns to central portions of the overlapping areas of the LED or OLED arrays, and surrounding these with noise-carrying time-varying spatially-distributed light patterns in outer portions of the overlapping areas of the LED or OLED arrays. In this way secure optical data exchange capabilities can be provided between pairs of user devices. Such secure optical data exchange capabilities can be used in place of thumb drives, infrared optical communications, WiFi, email, etc.

The invention provides for a common LED or OLED array to be used for two or more of display, document scanning, and other functionalities including touch screen sensing, touch gesture user interfaces, hand-image gesture sensing, fingerprint and/or processing, and document scanning. Such resulting integrated-function configurations can dramatically decrease the component count and system complexity for contemporary and future mobile devices such as cellphones, smartphones, PDAs, tablet computers, and other such devices.

In some embodiments, a common processor to be used for two or more of display, document scanning, and other functionalities including touch screen sensing and/or processing, touch gesture user interfaces, hand-image gesture sensing, restore recognition, and fingerprint scanning and/or processing, and document scanning. Such resulting integrated-function configurations can dramatically decrease the component count and system complexity for contemporary and future mobile devices such as cellphones, smartphones, PDAs, tablet computers, and other such devices.

CLOSING

While the invention has been described in detail with reference to disclosed embodiments, various modifications within the scope of the invention will be apparent to those of ordinary skill in this technological field. It is to be appreciated that features described with respect to one embodiment typically can be applied to other embodiments.

The invention can be embodied in other specific forms without departing from the spirit or essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein. Therefore, the invention properly is to be construed with reference to the claims.

Although exemplary embodiments have been provided in detail, it should be understood that various changes, substitutions and alternations could be made thereto without departing from spirit and scope of the disclosed subject matter as defined by the appended claims. Variations described for exemplary embodiments may be realized in any combination desirable for each particular application. Thus particular limitations, and/or embodiment enhancements described herein, which may have particular advantages to a particular application, need not be used for all applications. Also, not all limitations need be implemented in methods, systems, and/or apparatuses including one or more concepts described with relation to the provided exemplary embodiments.

The invention claimed is:

1. A system for implementing integrated combinations of a touch screen tactile sensor, a touch gesture sensor, a color image display, and one or more of a hand-image gesture sensor, a document scanner, a secure optical data exchange, and fingerprint processing capabilities, the system comprising:

a display comprising an organic light emitting diode (OLED) array, the OLED array comprising a plurality of individual OLEDs, the OLED array configured for both light-emitting and light sensing capabilities, wherein each OLED can emit modulated light and the system is responsive to reflection of modulated light from at least a human finger to the OLED array, the modulated light being used for the selective detection of reflected modulated light and the rejection of non-reflected light;

a controller operatively coupled to an electrical interface, the controller interfaced to the OLED array via the electrical interface, the controller further comprising software implementing at least one reflected-light image-formation operation and software implementing at least one non-reflected-light image-formation operation;

wherein the OLED array is to selectively operate as a color image display with touch screen tactile sensor implementing touch sensing suitable for touch gesture processing and selectively operate at least one non-reflected light imaging application, wherein the touch screen tactile sensor operation implementing touch sensing when selectively active employs the reflected-light image-formation operation, and wherein the at least one non-reflected light imaging application when selectively active employs the non-reflected-light image-formation operation.

2. The system of claim 1, wherein the controller is a processor operatively coupled to a memory storing one or more algorithms implemented as software for executing on the controller.

3. The system of claim 1, wherein at least some of the individual OLEDs perform a light detection function at least for an interval of time, the light detection function comprising a photoelectric effect that is communicated to the controller via the electrical interface of the processor.

4. The system of claim 1, wherein the system further comprises software implementing gesture user interface recognition and parameter extraction functions.

5. The system of claim 1, wherein the OLED array is further configured to comprise a vignetting arrangement designed to impose a specific structure on an incoming light field to create a structured light field suitable for image formation of non-reflected light by the non-reflected-light image-formation operation.

6. The system of claim 1, wherein the OLED array is further provided with a vignetting arrangement designed to impose a specific structure on an incoming light field to create a structured light field suitable for image formation of non-reflected light by the non-reflected-light image-formation operation.

7. The system of claim 5, wherein the resulting system is further configured to selectively operated as a light-field sensor utilizing the non-reflected-light image-formation operation.

8. The system of claim 6, wherein the resulting system is further configured to selectively operated as a light-field sensor utilizing the non-reflected-light image-formation operation.

9. The system of claim 7, wherein the system is further configured to implement a lensless imaging camera.

10. The system of claim 8, wherein the controller is further configured to implement a lensless imaging camera.

11. The system of claim 1, wherein the controller is further configured to execute image formation functions utilizing the non-reflected-light image-operation.

12. The system of claim 1, wherein the system is further configured to operate as a proximate hand gesture sensor utilizing the non-reflected-light image-formation operation.

13. The system of claim 1, wherein the non-reflected-light image-formation operation comprises proximate hand gesture processing functions.

14. The system of claim 1, wherein the system is further configured to operate as a document scanner utilizing the reflected-light image-formation operation.

15. The system of claim 14, the system further comprising software implementing document scanner processing functions.

16. The system of claim 1, wherein the optical image sensing resolution of the OLED array is sufficient for the system to operate as a fingerprint scanner.

17. The system of claim 1, wherein the system is further configured to operate as a fingerprint scanner utilizing the reflected-light image-formation operation.

18. The system of claim 1, the system further comprising software implementing fingerprint processing functions.

19. The system of claim 1, wherein the system is further configured to operate as a secure optical communications interface utilizing at least the OLED sensing capability of the OLED array.

20. The system of claim 1, the system further comprising software implementing optical communications processing functions facilitating optical communications exchange with at least a display of another system.

* * * * *